United States Patent
Kang et al.

(10) Patent No.: US 12,183,715 B2
(45) Date of Patent: Dec. 31, 2024

(54) METHOD FOR MANUFACTURING SEMICONDUCTOR STRUCTURE

(71) Applicant: NANYA TECHNOLOGY CORPORATION, New Taipei (TW)

(72) Inventors: Ting-Cih Kang, New Taipei (TW); Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 218 days.

(21) Appl. No.: 17/546,283

(22) Filed: Dec. 9, 2021

(65) Prior Publication Data
US 2022/0102319 A1 Mar. 31, 2022

Related U.S. Application Data

(62) Division of application No. 17/024,344, filed on Sep. 17, 2020, now abandoned.

(51) Int. Cl.
*H01L 25/065* (2023.01)
*H01L 23/00* (2006.01)
*H01L 23/48* (2006.01)

(52) U.S. Cl.
CPC ........ *H01L 25/0657* (2013.01); *H01L 23/481* (2013.01); *H01L 24/05* (2013.01); *H01L 24/08* (2013.01); *H01L 2224/02215* (2013.01); *H01L 2224/05022* (2013.01); *H01L 2224/05073* (2013.01); *H01L 2224/05124* (2013.01); *H01L 2224/05147* (2013.01);
(Continued)

(58) Field of Classification Search
CPC ......... H01L 21/76898; H01L 21/76849; H01L 21/7685; H01L 23/481; H01L 2224/022–02215; H01L 2224/03019; H01L 2224/05562; H01L 2224/08145–08148; H01L 2224/80007; H01L 2224/8002; H01L 2224/80357; H01L 2224/80894–80896; H01L 2225/06541; H01L 2225/06544
See application file for complete search history.

(56) References Cited

U.S. PATENT DOCUMENTS 6,927,113 B1 * 8/2005 Sahota ................ H01L 21/7684
257/E21.583
9,449,950 B2 * 9/2016 Huang ................ H01L 25/0657
(Continued)

OTHER PUBLICATIONS

Office Action mailed on Sep. 14, 2022 related to U.S. Appl. No. 17/024,344, wherein this application is a DIV of U.S. Appl. No. 17/024,344.
(Continued)

*Primary Examiner* — Yu Chen
(74) *Attorney, Agent, or Firm* — Xuan Zhang

(57) ABSTRACT

The present disclosure provides a method for manufacturing a semiconductor structure employing a via structure. The method includes forming a first conductive pad on a first semiconductor device; forming a second conductive pad on the first conductive pad; connecting a second semiconductor device to the first semiconductor device; and forming a via structure in the second semiconductor device, The via structure contacts the second conductive pad, and the first conductive pad and the second conductive pad are formed of different metal materials.

10 Claims, 20 Drawing Sheets

(52) U.S. Cl.
CPC ............... *H01L 2224/05561* (2013.01); *H01L 2224/05564* (2013.01); *H01L 2224/05571* (2013.01); *H01L 2224/05572* (2013.01); *H01L 2224/05573* (2013.01); *H01L 2224/05639* (2013.01); *H01L 2224/05644* (2013.01); *H01L 2224/05684* (2013.01); *H01L 2224/08146* (2013.01); *H01L 2225/06541* (2013.01)

(56) References Cited

U.S. PATENT DOCUMENTS

| | | |
|---|---|---|
| 2007/0269978 A1 | 11/2007 | Shih et al. |
| 2009/0218691 A1 | 9/2009 | Yang et al. |
| 2011/0042814 A1 | 2/2011 | Okuyama |
| 2013/0285253 A1* | 10/2013 | Aoki ................ H01L 21/82 438/455 |
| 2014/0264875 A1 | 9/2014 | Kanki |
| 2015/0021771 A1* | 1/2015 | Lin ................ H01L 23/481 438/459 |
| 2015/0279888 A1* | 10/2015 | Chen ................ H01L 24/08 257/459 |
| 2017/0110369 A1 | 4/2017 | Kanki et al. |
| 2018/0068984 A1 | 3/2018 | Beyne et al. |
| 2020/0161277 A1* | 5/2020 | Lee ................ H01L 21/76898 |
| 2020/0402942 A1* | 12/2020 | Chen ................ H01L 24/95 |
| 2021/0028148 A1* | 1/2021 | Wu ................ H01L 25/50 |
| 2021/0057332 A1* | 2/2021 | Chen ................ H01L 21/76807 |

OTHER PUBLICATIONS

Office Action mailed on Mar. 8, 2022 related to U.S. Appl. No. 17/024,344, wherein this application is a DIV of U.S. Appl. No. 17/024,344.

Office Action mailed on May 9, 2023 related to U.S. Appl. No. 17/024,344, wherein this application is a DIV of U.S. Appl. No. 17/024,344.

Office Action mailed on Feb. 14, 2023 related to U.S. Appl. No. 17/024,344, wherein this application is a DIV of U.S. Appl. No. 17/024,344.

Office Action mailed on Oct. 12, 2023 related to U.S. Appl. No. 17/024,344, wherein this application is a DIV of U.S. Appl. No. 17/024,344.

* cited by examiner

METHOD FOR MANUFACTURING SEMICONDUCTOR STRUCTURE

CROSS-REFERENCE TO RELATED APPLICATION

This application is a divisional application of U.S. Non-Provisional application Ser. No. 17/024,344 filed on Sep. 17, 2020, which is incorporated herein by reference in its entirety.

TECHNICAL FIELD

The present disclosure relates to a method for manufacturing a semiconductor structure, and more particularly, to a method for manufacturing a semiconductor structure employing a via structure.

DISCUSSION OF THE BACKGROUND

With increasing demand for higher performance in semiconductor industries, package technology has evolved from two-dimensional (2D) to three-dimensional (3D) wafer packages, so as to improve the density and performance of circuits in integrated circuit devices.

In a 3D wafer package, two wafers are bonded to conductive pads, and through silicon via (TSV) electrodes are then formed to connect conductive pads on the first and second wafers. The TSV electrode is usually made of copper or other conductive material to provide electrical connections between conductive pads.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure including a first semiconductor device and a second semiconductor device. The first semiconductor device includes a first semiconductor substrate, a first conductive pad and a second conductive pad. The first conductive pad is disposed on the first semiconductor substrate. The second conductive pad is disposed on the first conductive pad. The second semiconductor device is disposed on the first semiconductor device and comprises a second semiconductor substrate and a via structure. The via structure is disposed in the second semiconductor substrate and contacts the second conductive pad. Chemical reactivity of the second conductive pad is less than chemical reactivity of the first conductive pad.

In some embodiments, a thickness of the second conductive pad is less than a thickness of the first conductive pad.

In some embodiments, the first conductive pad comprises copper (Cu), aluminum (Al), or a combination thereof.

In some embodiments, the second conductive pad comprises tungsten (W), gold (Au), silver (Ag), or a combination thereof.

In some embodiments, an upper surface of the second conductive pad is substantially coplanar with an upper surface of the first semiconductor device.

In some embodiments, the via structure is a through silicon via (TSV).

Another aspect of the present disclosure provides a semiconductor structure including a first chip and a second chip. The first chip includes a first semiconductor substrate and a conductive pad. The conductive pad is disposed on the first semiconductor substrate. The second chip includes a second substrate and a via structure. The via structure is disposed in the second semiconductor substrate and contacts the conductive pad. Chemical reactivity of the conductive pad increases at positions along a direction from the via structure to the first semiconductor substrate.

In some embodiments, the conductive pad comprises a first portion and a second portion, and the second portion is located between the first portion and the via structure.

In some embodiments, a thickness of the second portion is less than a thickness of the first portion.

In some embodiments, the first portion and the second portion are formed of different metal materials.

In some embodiments, chemical reactivity of the second portion is less than chemical reactivity of the first portion.

In some embodiments, the conductive pad comprises a step structure, wherein a step height of the step structure is less than 1 µm.

In some embodiments, an aspect ratio of the via structure is less than 10:1.

Another aspect of the present disclosure provides a method of manufacturing a semiconductor structure including following operations: forming a first conductive pad on a first semiconductor device; forming a second conductive pad on the first conductive pad; connecting a second semiconductor device to the first semiconductor device; and forming a via structure in the second semiconductor device, wherein the via structure contacts the second conductive pad. The first conductive pad and the second conductive pad are formed of different metal materials.

In some embodiments, the forming of the second conductive pad on the first conductive pad includes forming a dielectric layer on the first conductive pad, and forming an opening in the dielectric layer to expose the first conductive pad.

In some embodiments, the forming of the second conductive pad on the first conductive pad includes forming the second conductive pad in the opening.

In some embodiments, the method further includes forming the first conductive pad and the second conductive pad such that each of the first conductive pad and the second conductive pad has chemical reactivity increasing at positions along a direction from the via structure to the first semiconductor device.

In some embodiments, the method further includes forming the second conductive pad with a thickness that is less than a thickness of the first conductive pad.

In some embodiments, the method further includes forming a step structure between the first conductive pad and the second conductive pad. A step height of the step structure is less than 1 µm.

In some embodiments, the method further includes forming the via structure with an aspect ratio less than 10:1.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
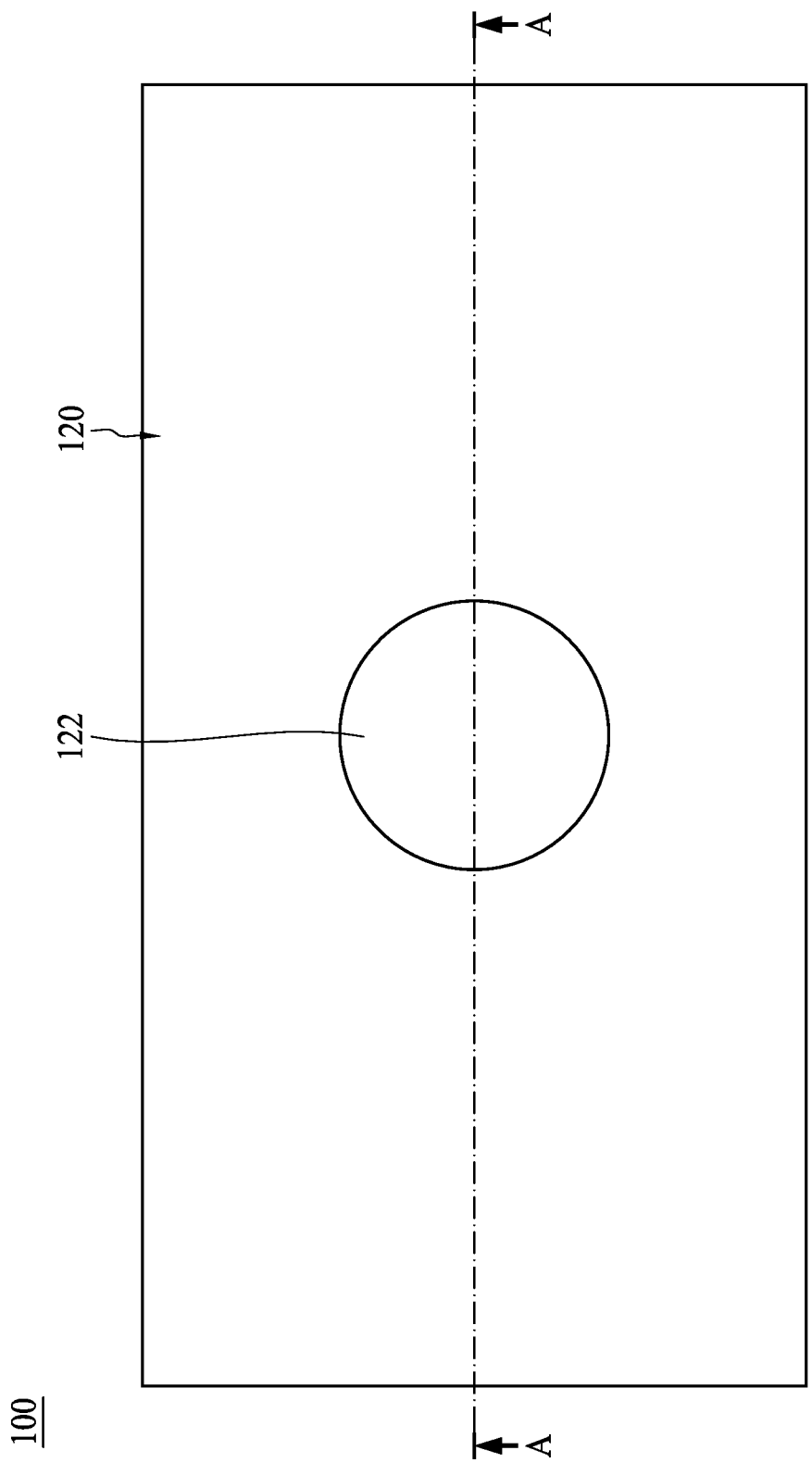
FIG. 1 is a top view of a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be understood that similar features in FIGS. 4 to 8 and 10 to 14 are identified by the same reference numerals for clarity and simplicity. Furthermore, similar elements in FIGS. 4 to 8 and 10 to 14 can include similar materials, and thus descriptions of such details are omitted in the interest of brevity.

The semiconductor structure of the present disclosure may include a conductive pad having different levels of chemical reactivity at different positions of the conductive pad. For example, chemical reactivity of an upper portion of the conductive pad is less than chemical reactivity of a lower portion of the conductive pad. Thus, the upper portion is less easily oxidized than the lower portion and the oxidization of the conductive pad may be prevented. As a result, the conductivity between the conductive pad and the via structure may be increased, and the device stability of the semiconductor structure may be improved.

Moreover, the aspect ratio of the via structure in the semiconductor device may be decreased. In other words, the via structure may be relatively short in a vertical dimension and wide in a horizontal dimension. As a result, a yield rate of the via structure may be increased. In summary, the semiconductor structure of the present disclosure may improve the device stability and increase the yield rate compared to the conventional semiconductor structure.

The detailed semiconductor structure of the present disclosure is described below.

Figure 2:
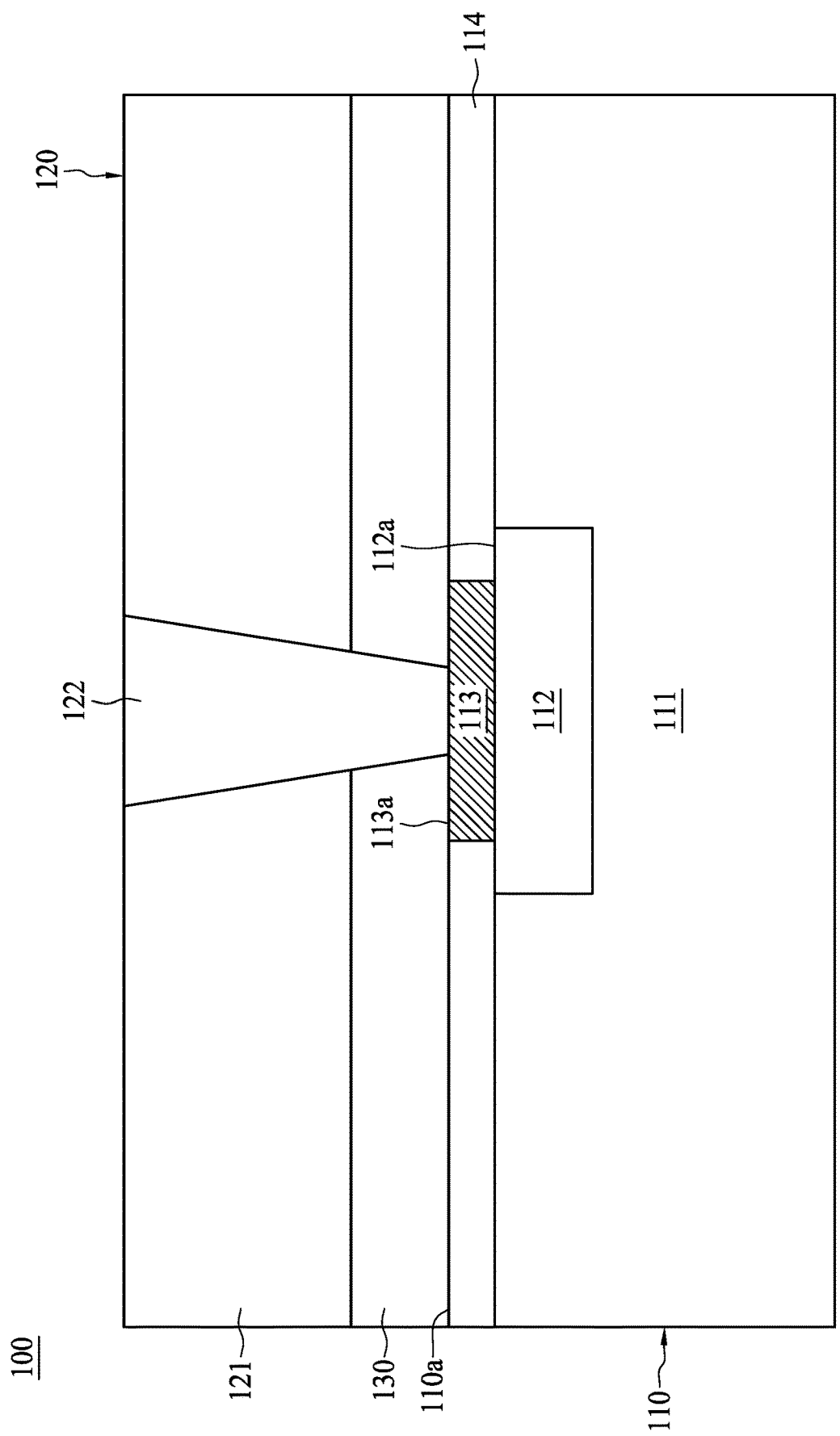
FIG. 2 is a cross-sectional view of the semiconductor structure along a line A-A in FIG. 1.

In accordance with some embodiments of the disclosure, FIG. 1 is a top view of a semiconductor structure 100 and FIG. 2 is a cross-sectional view of the semiconductor structure 100 along a line A-A in FIG. 1. With reference to FIG. 1 and FIG. 2, in some embodiments, the semiconductor structure 100 includes a first semiconductor device 110 and a second semiconductor device 120.

In some embodiments, the first semiconductor device 110 may be referred to as a first chip. The first semiconductor device 110 may include a logic device, a memory device (e.g., SRAM), an RF device, an input/output (I/O) device, a system-on-chip (SOC) device, a system-in-chip (SIC) device, another suitable type of device, or a combination thereof.

In some embodiments, the first semiconductor device 110 includes a first semiconductor substrate 111, a first conductive pad 112, and a second conductive pad 113. The first semiconductor substrate 111 may be made of semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used.

In some embodiments, the first conductive pad 112 is disposed on the first semiconductor substrate 111. In some embodiments, the first conductive pad 112 may be a metal pad. In some embodiments, the first conductive pad 112 includes conductive material such as copper (Cu), aluminum (Al), another suitable conductive material, or a combination thereof. It should be noted that the quantity of the first conductive pads 112 on the first semiconductor substrate 111 is not limited.

In some embodiments, the second conductive pad 113 is disposed on the first conductive pad 112. In some embodiments, the second conductive pad 113 may be a metal pad. In some embodiments, the first conductive pad 112 includes conductive material such as tungsten (W), gold (Au), silver (Ag), another suitable conductive material, or a combination thereof. It should be noted that the quantity of the second conductive pads 113 on the first semiconductor substrate 111 is not limited.

The first conductive pad 112 and the second conductive pad 113 are formed of different metal materials. In some embodiments, chemical reactivity of the second conductive pad 113 is less than chemical reactivity of the first conductive pad 112. In other words, the second conductive pad 113 is less easily oxidized than the first conductive pad 112.

In some embodiments, the second conductive pad 113 may be used as a protective layer for the first conductive pad 112. The first conductive pad 112 may be oxidized when an upper surface of the first conductive pad 112 is exposed through the layer formed thereon. In some embodiments, the second conductive pad 113 may protect the first conductive pad 112 from oxidization. In other words, the second conductive pad 113 may mitigate the effect of the oxidization of the first conductive pad 112.

In some embodiments, the second conductive pad 113 may be used as a layer for filling the gap between an upper surface 112a of the first conductive pad 112 and an upper surface 110a of the first semiconductor device 110. A thickness of the first conductive pad 112 may be decreased during different manufacturing operations, for example but not limited to, etching operations, probing operations, or other operations performed during manufacturing. In some embodiments, the second conductive pad 113 may be used to fill in a space caused by the decreased portion of the first conductive pad 112. In other words, the second conductive pad 113 may mitigate the effect of the reduction of the first conductive pad 112.

In some embodiments, an upper surface 113a of the second conductive pad 113 is substantially coplanar with the upper surface 110a of the first semiconductor device 110. A thickness of the second conductive pad 113 may be less than the thickness of the first conductive pad 112. In some embodiments, the thickness of the second conductive pad 113 may be less than 1 μm.

In some embodiments, a dielectric layer 114 may be disposed on the first conductive pad 112 before the second conductive pad 113 is formed. In the subsequent manufacturing operations, an opening is formed in the dielectric layer 114 to expose a portion of the first conductive pad 112. The second conductive pad 113 is formed in the opening and on the first conductive pad 112. In some embodiments, the dielectric layer 114 may include dielectric materials, such as oxide, nitride, polymer or the like.

In some embodiments, the second semiconductor device 120 may be referred to as a second chip. The second semiconductor device 120 may include a logic device, a memory device (e.g., an SRAM), an RF device, an input/output (I/O) device, a system-on-chip (SOC) device, a system-in-chip (SIC) device, another suitable type of device, or a combination thereof. The first semiconductor device 110 and the second semiconductor device 120 may be the same or different devices. For example, the first semiconductor device 110 may be a system-on-chip (SOC) device and the second semiconductor device 120 may be a memory device. It should be understood that the application is not limited to a particular type of device.

In some embodiments, the second semiconductor device 120 is disposed on the first semiconductor device 110. In some embodiments, the second semiconductor device 120 is connected to the first semiconductor device 110 by an adhesive layer 130. The second semiconductor device 120 may include a second semiconductor substrate 121 and a via structure 122.

The second semiconductor substrate 121 may be made of semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used.

In some embodiments, the via structure 122 is disposed in the second semiconductor substrate 121 and contacts the second conductive pad 113. The via structure 122 is formed of conductive material. In some embodiments, the via structure 122 may be a through substrate via or through silicon via (TSV). The via structure 122 may directly or indirectly contact the second conductive pad 113. The second semiconductor device 120 is electrically connected to the first semiconductor device 110 through the via structure 122. It should be noted that the shape and quantity of the via structures 122 are not limited.

Figure 3:
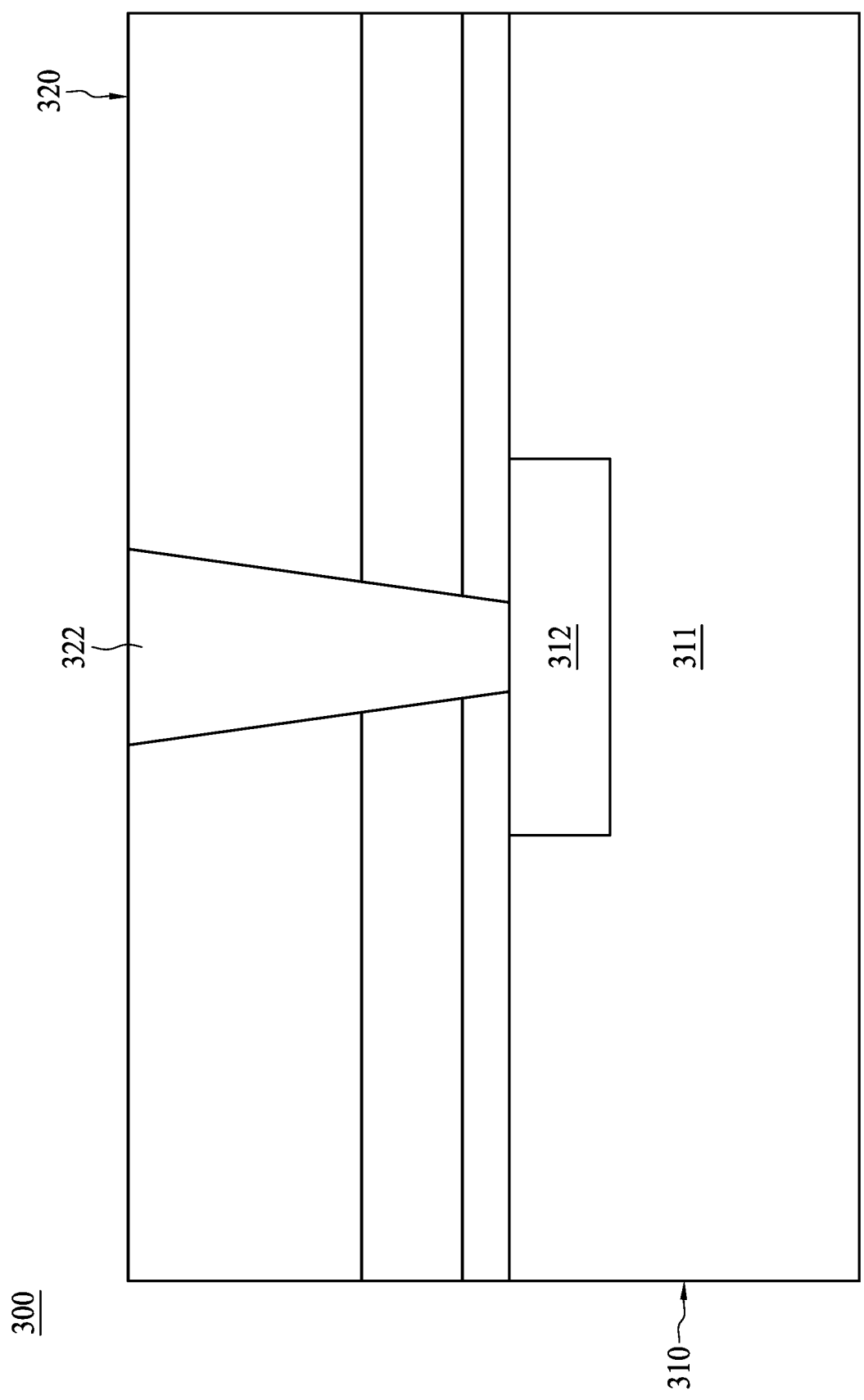
FIG. 3 is a cross-sectional view of a conventional semiconductor structure.

FIG. 3 is a cross-sectional view of a conventional semiconductor structure 300. With reference to FIG. 3, the semiconductor structure 300 includes semiconductor chips 310 and 320. The semiconductor chip 310 has a metal pad 312 formed on a substrate 311. The semiconductor chip 320 is electrically connected to the semiconductor chip 310 through a via structure 322. The metal pad 312 of the semiconductor structure 300 is a single-layered metal pad. The via structure 322 of the second chip 320 contacts the single-layered metal pad 312.

The semiconductor structure 300 may have some issues, as described below. During manufacturing operations, the single-layered metal pad 312 may be over-etched or oxidized. For example, when the metal pad 312 is over-etched during the etching operation, the thickness of the metal pad 312 may be decreased due to the etching operation. As a result, the aspect ratio of the via structure 322 may be increased. For example, the aspect ratio of the via structure 322 may be as high as 10:1, which means a shape of the via structure 322 is relatively tall in a vertical dimension and narrow in a horizontal dimension. Accordingly, the via structure 322 may be difficult to form and a yield rate of the via structure 322 may be decreased.

Moreover, the metal pad 312 may be oxidized during the manufacturing operation. The conductivity between the metal pad 312 and the via structure 322 may be reduced due to the oxidization of the metal pad 312. As a result, the device stability of the semiconductor structure 300 may be decreased.

Referring back to FIG. 1 and FIG. 2, compared to the conventional semiconductor structure 300 in FIG. 3, the semiconductor structure 100 of the present disclosure includes the first conductive pad 112 and the second conductive pad 113. In some embodiments, chemical reactivity of the second conductive pad 113 is less than chemical reactivity of the first conductive pad 112. In other words, the second conductive pad 113 is less easily oxidized than the first conductive pad 112, and the second conductive pad 113 may protect the first conductive pad 112 from oxidization. As a result, the conductivity between the first conductive pad 112, the second conductive pad 113 and the via structure 122 may be increased, and the device stability of the semiconductor structure 100 may be improved.

Moreover, the second conductive pad 113 may be used as an intermediate layer between the via structure 122 and the first conductive pad 112. In other words, after the thickness of the first conductive pad 112 is reduced during the etching operation, the second conductive pad 113 is provided for connecting the via structure 122 to the first conductive pad 112. As a result, an aspect ratio of the via structure 122 is less than an aspect ratio of the via structure 322 of the semiconductor structure 300 in FIG. 3. For example, but not limited thereto, the aspect ratio of the via structure 122 may be as low as 10:1. In some embodiments, the aspect ratio of the via structure 122 may be as low as 8:1. In other words, the via structure 122 is relatively short in the vertical dimension and wide in the horizontal dimension. As a result, a yield rate of the via structure 122 may be increased.

In summary, the semiconductor structure 100 of the present disclosure may improve the device stability and increase the yield rate compared to the conventional semiconductor structure 300 in FIG. 3.

Figure 4:
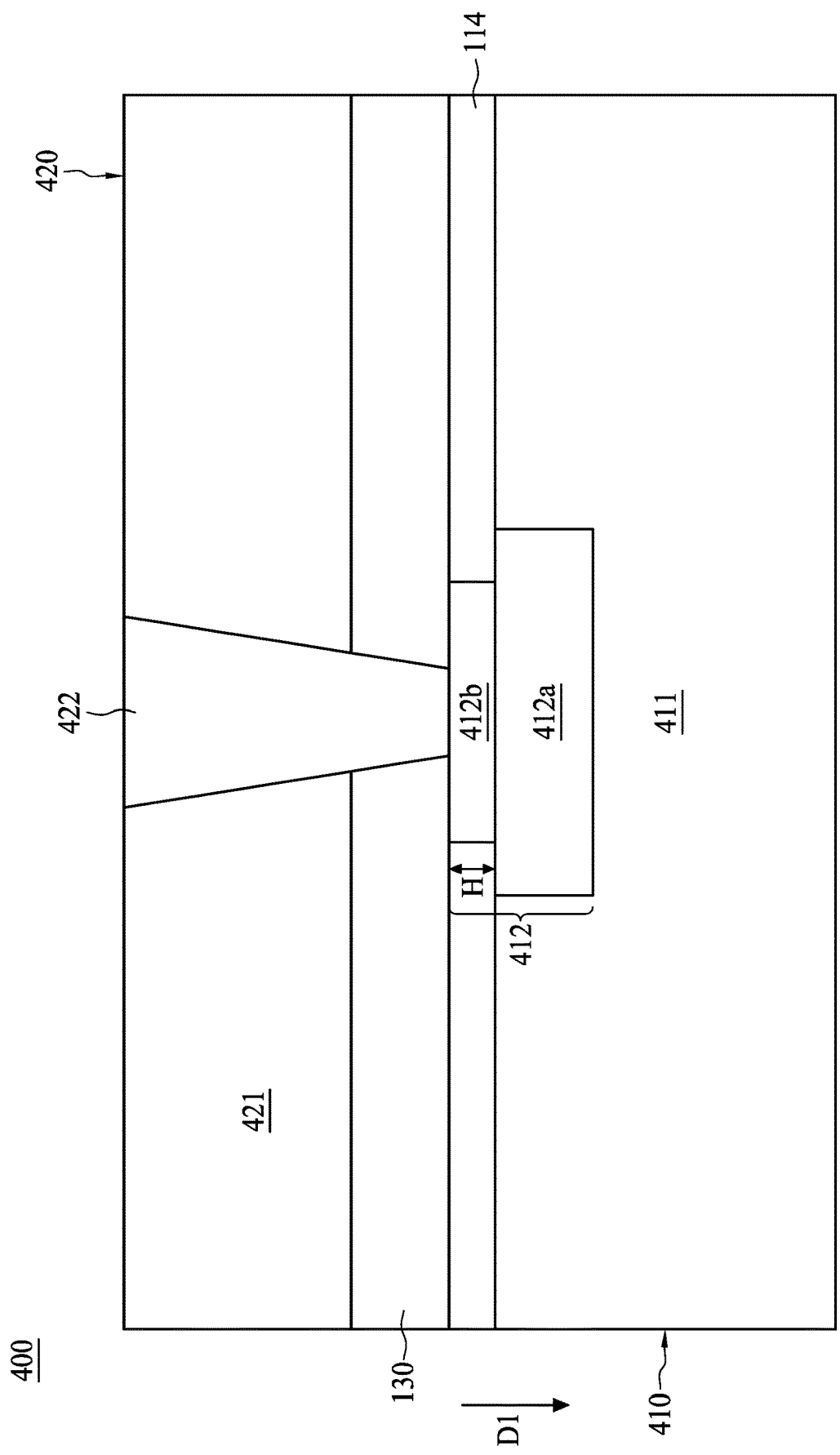
FIG. 4 is a cross-sectional view of a semiconductor structure in accordance with some embodiments of the present disclosure.

In accordance with some embodiments of the disclosure, FIG. 4 is a cross-sectional view of a semiconductor structure 400. The semiconductor structure 400 includes a first chip 410 and a second chip 420. The first chip 410 and the second chip 420 may be referred to as the first semiconductor device and the second semiconductor device. In some embodiments, embodiments of the first chip 410 and the second chip 420 are similar to embodiments of the first semiconductor device 110 and the second semiconductor device 120 in FIG. 1 and FIG. 2, and repeated descriptions thereof are omitted for brevity.

The first chip 410 includes a first semiconductor substrate 411 and a conductive pad 412. The second chip 420 includes a second semiconductor substrate 421 and a via structure 422. The semiconductor material of the first semiconductor substrate 411 and the second semiconductor substrate 421 are similar to that of the first semiconductor substrate 111 and the second semiconductor substrate 121 in FIG. 2, and repeated descriptions are omitted herein for brevity. The via structure 422 is similar to the via structure 122 in FIG. 2, and repeated description thereof is omitted for brevity.

The conductive pad 412 is disposed on the first semiconductor substrate 411. In some embodiments, chemical reactivity of the conductive pad 412 increases at positions along a direction D1 from the via structure 422 to the first semiconductor substrate 411. In some embodiments, the conductive pad 412 may include a conductive material with different chemical reactivity at different positions. For example, the conductive material has a smaller amount of chemical activity at the portion near the via structure 422 than at the portion near the first semiconductor substrate 411.

In some embodiments, the conductive pad 412 includes a first portion 412a and a second portion 412b. The second portion 412b is located between the first portion 412a and the via structure 422. Chemical reactivity of the second portion 412b is less than chemical reactivity of the first portion 412a.

The first portion 412a and the second portion 412b may be formed of different metal materials. In some embodiments, the first portion 412a may include metal material such as copper (Cu), aluminum (Al), another suitable conductive material, or a combination thereof. In some embodiments, the second portion 412b may include metal material such as tungsten (W), gold (Au), silver (Ag), another suitable conductive material, or a combination thereof.

As shown in FIG. 4, the conductive pad 412 has a step structure. In some embodiments, a step height H of the step structure is less than 1 μm. In some embodiments, a thickness (or the step height H) of the second portion 412b is less than a thickness of the first portion 412a. Moreover, a width of the second portion 412b may be less than a width of the first portion 412a.

Figure 5:
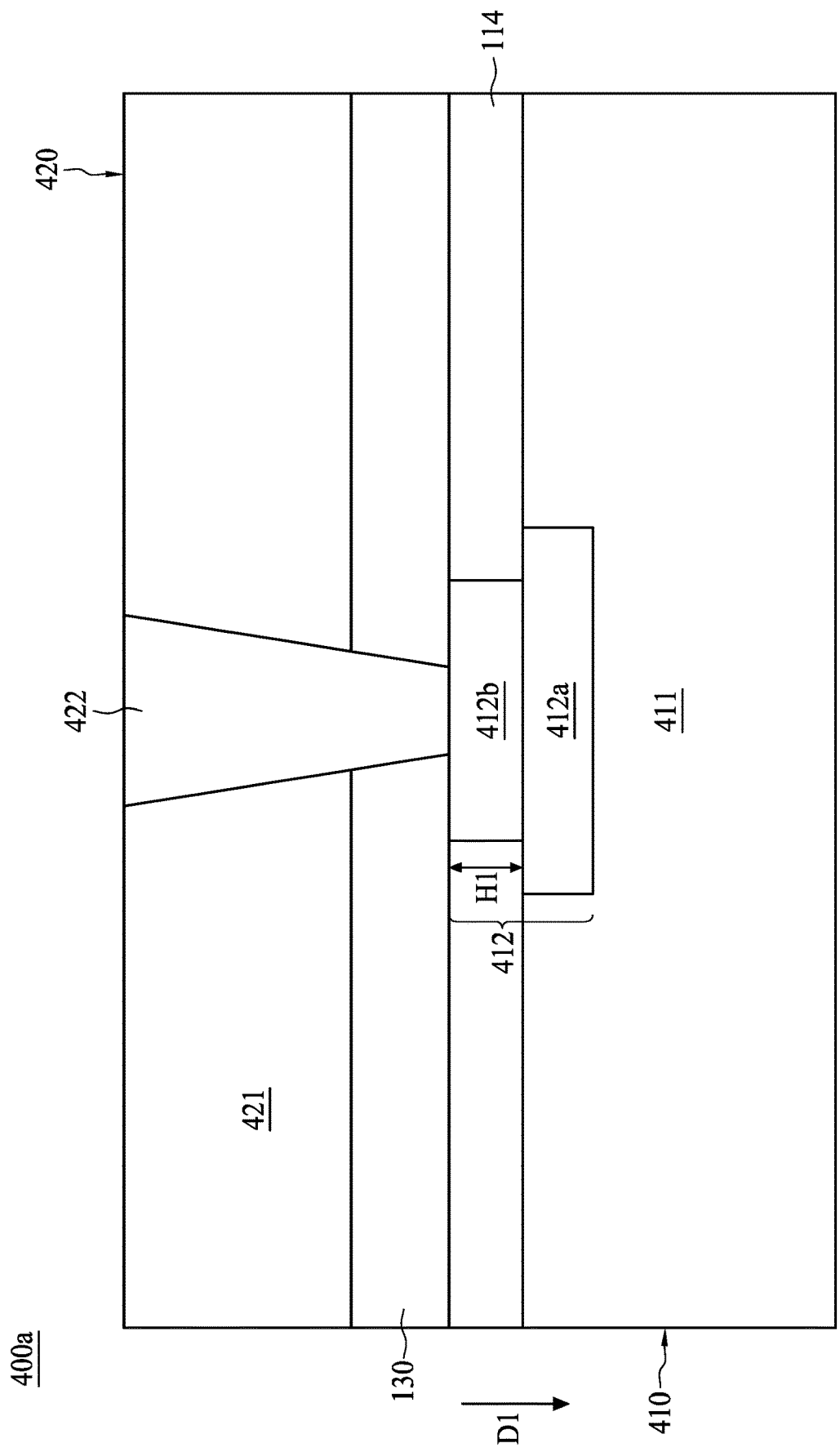
FIG. 5 and FIG. 6 are cross-sectional views of semiconductor structures in accordance with some embodiments of the present disclosure.
Figure 6:
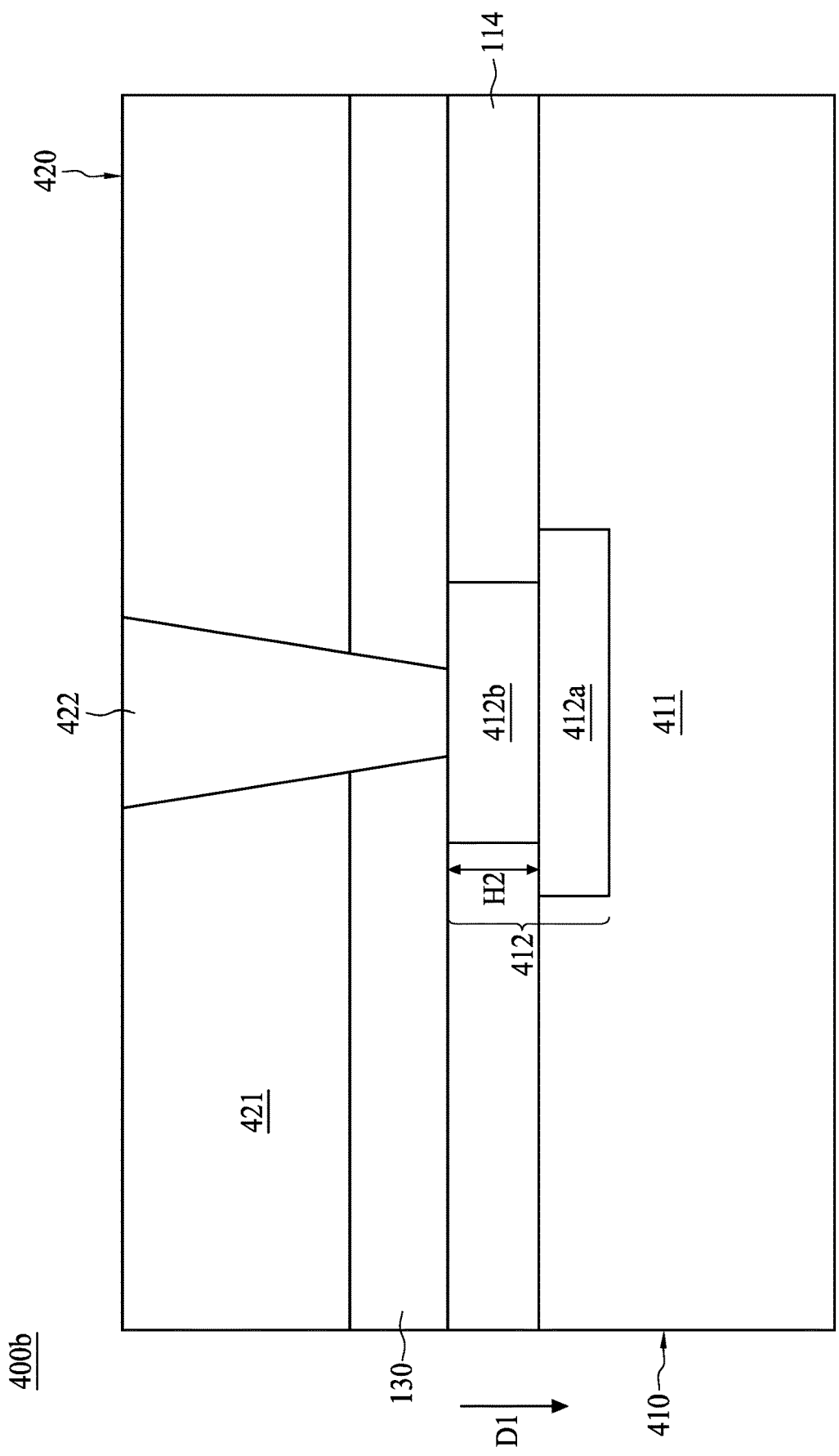

FIG. 5 and FIG. 6 are cross-sectional views of semiconductor structures 400a and 400b, respectively. As shown in FIG. 5, in some embodiments, the thickness of the second portion 412b may be substantially the same as the thickness of the first portion 412a. It should be noted that the step height H1 (or the thickness) of the second portion 412b is less than 1 μm. As shown in FIG. 6, in some embodiments, the thickness of the second portion 412b may be greater than the thickness of the first portion 412a. It should be noted that the step height H2 (or the thickness) of the second portion 412b is less than 1 μm. It should be understood that the relative thicknesses of the first portion 412a and the second portion 412b are not limited.

Figure 7:
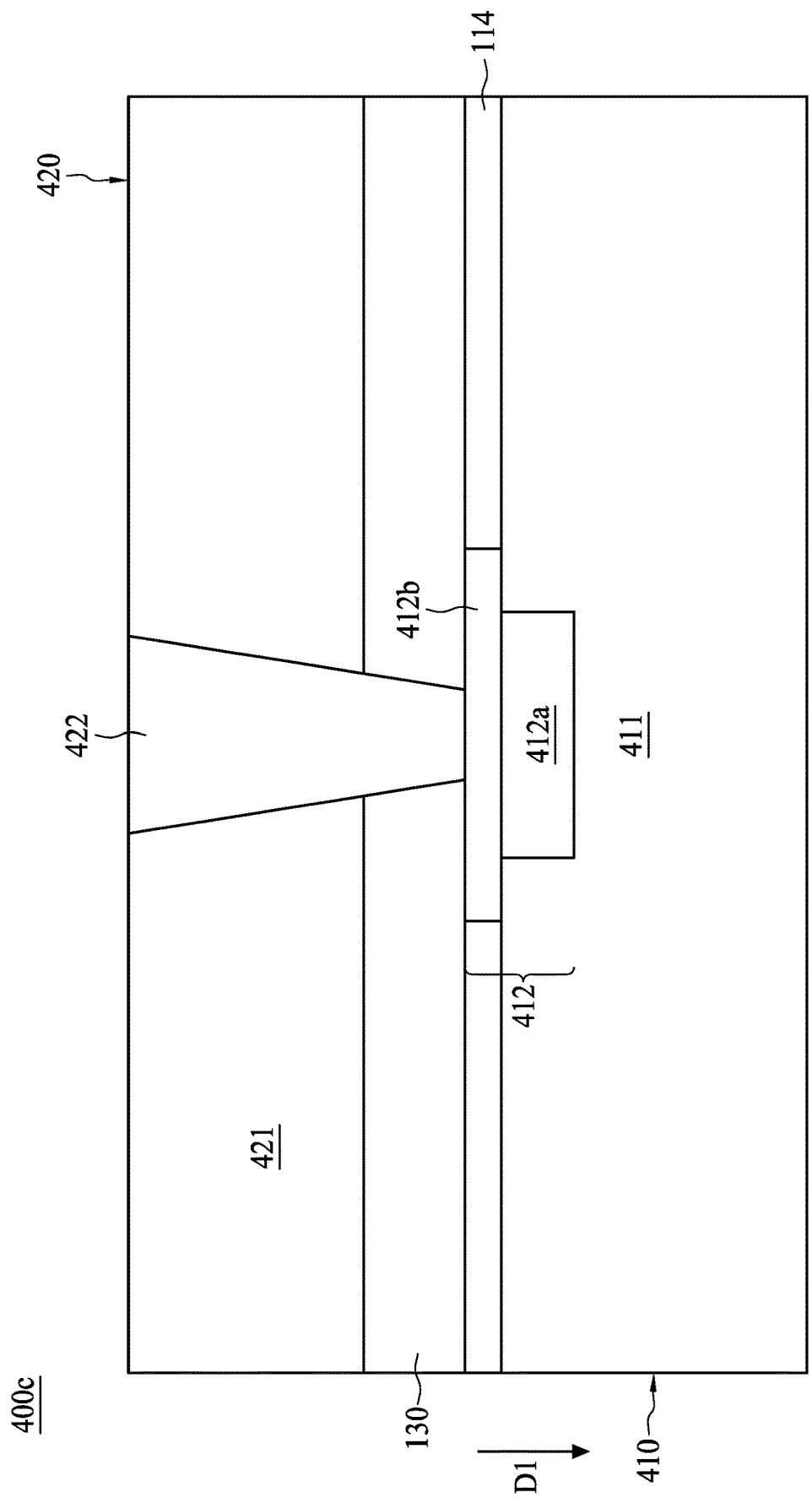
FIG. 7 and FIG. 8 are cross-sectional views of semiconductor structures in accordance with some embodiments of the present disclosure.
Figure 8:
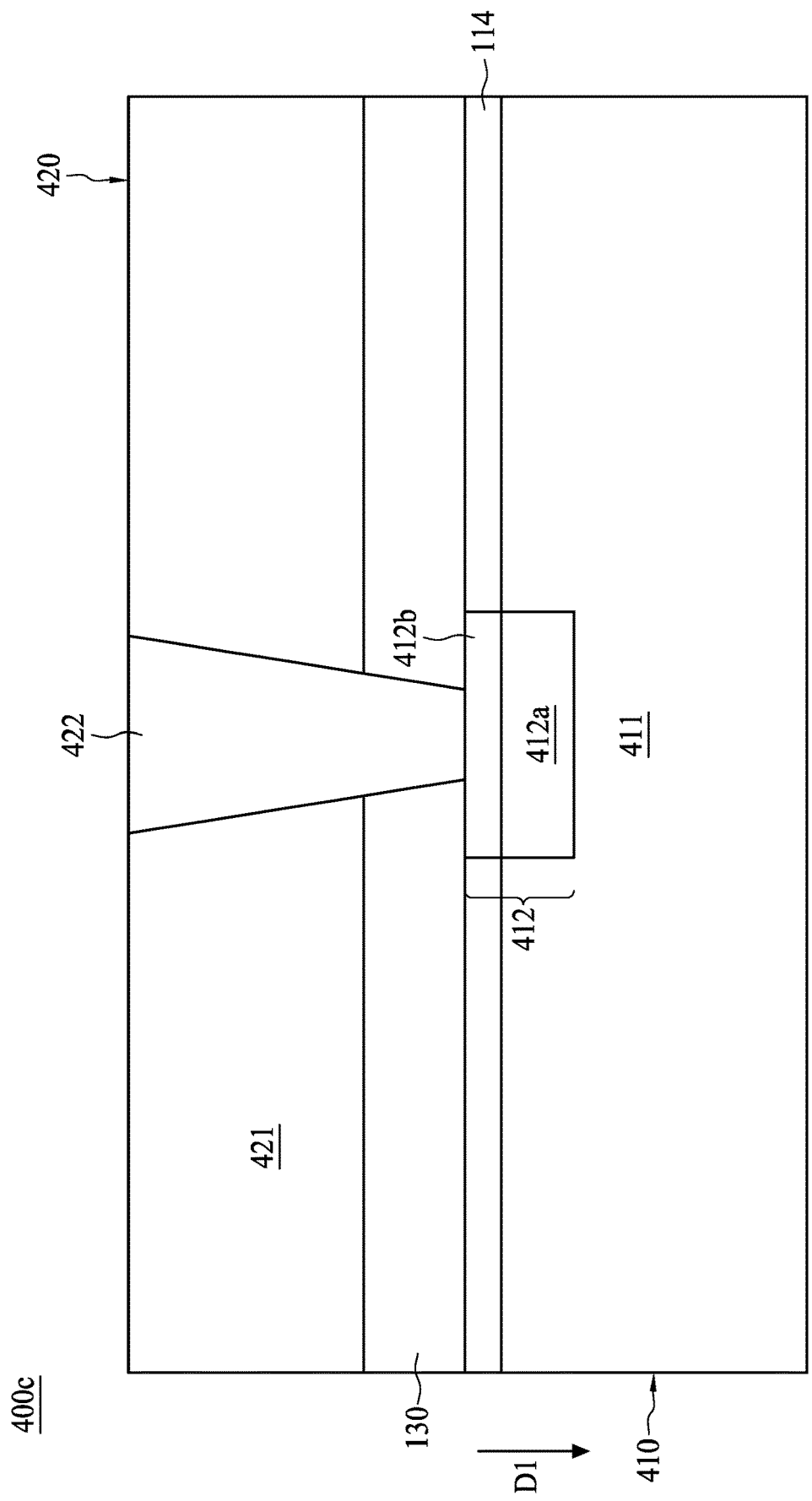

FIG. 7 and FIG. 8 are cross-sectional views of semiconductor structures 400c and 400d. As shown in FIG. 7, in some embodiments, the width of the second portion 412b may be greater than the width of the first portion 412a. As shown in FIG. 8, in some embodiments, the width of the second portion 412b may be substantially the same as the width of the first portion 412a. In other words, the conductive pad 412 may be formed in a non-stepped structure. It should be noted that the relative widths of the first portion 412a and the second portion 412b are not limited.

Referring back to FIG. 4, as described in reference to FIG. 1 and FIG. 2, in contrast to the conventional semiconductor structure 300 in FIG. 3, the semiconductor structure 400 of the present disclosure includes the conductive pad 412, in which chemical reactivity increases at positions along the direction D1 from the via structure 422 to the first semiconductor substrate 411. In other words, the second portion 412b of the conductive pad 412 near the via structure 422 is less easily oxidized and thus may protect the conductive pad 412 from oxidization. As a result, the conductivity between the conductive pad 412 and the via structure 422 may be increased, and the device stability of the semiconductor structure 400 may be improved.

Moreover, when the thickness of the conductive pad 412 is reduced during the etching operation, the second portion 412b of the conductive pad 412 is provided for connecting the via structure 422 to the conductive pad 412. Thus, the aspect ratio of the via structure 422 is less than the aspect ratio of the via structure 322 of the semiconductor structure 300 in FIG. 3. In other words, the via structure 422 is relatively short in the vertical dimension and wide in the horizontal dimension. As a result, a yield rate of the via structure 422 may be increased.

In summary, the semiconductor structure 400 of the present disclosure may improve the device stability and increase the yield rate compared to the conventional semiconductor structure 300 in FIG. 3.

Figure 9:
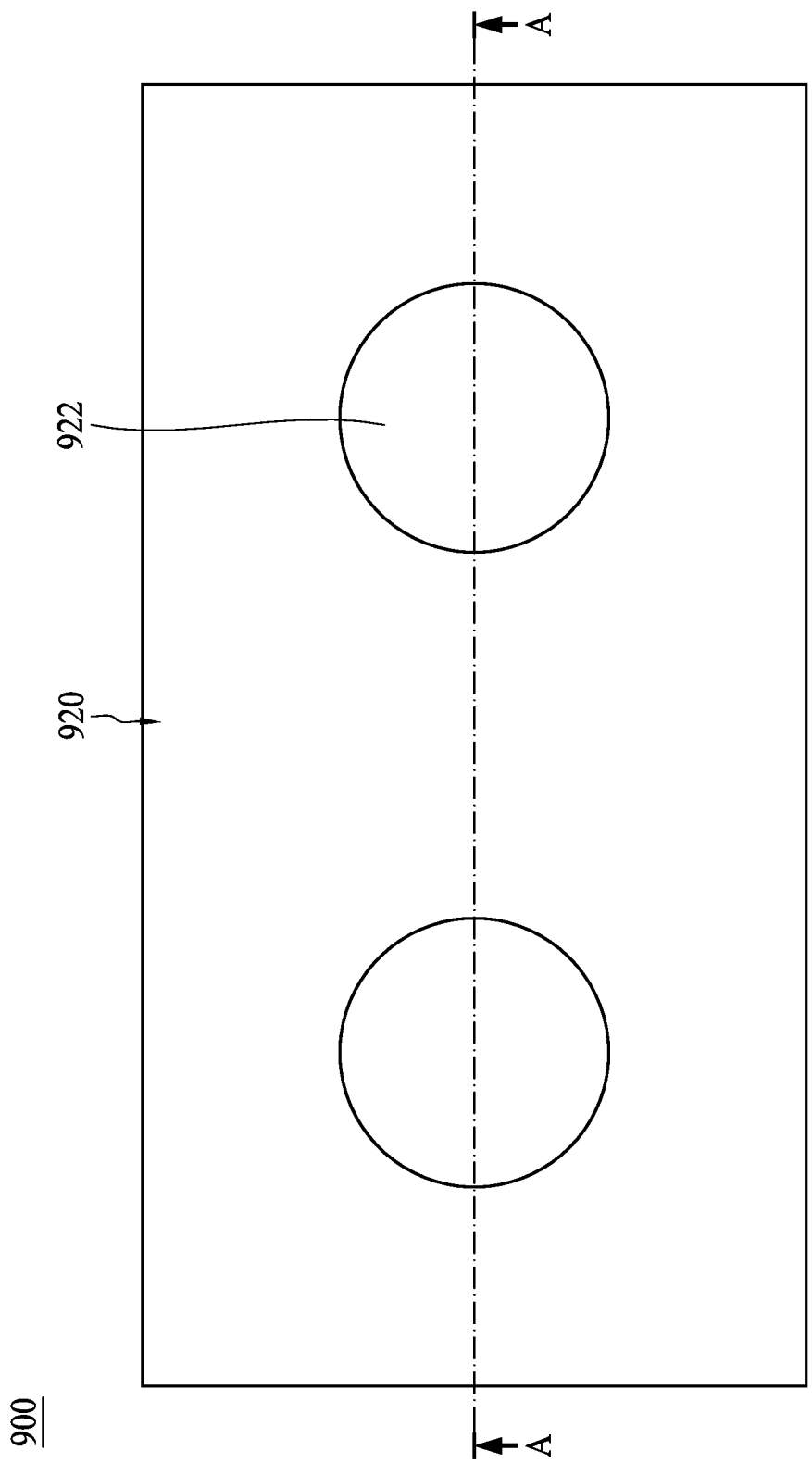
FIG. 9 is a top view of a semiconductor structure in accordance with some embodiments of the present disclosure.
Figure 10:
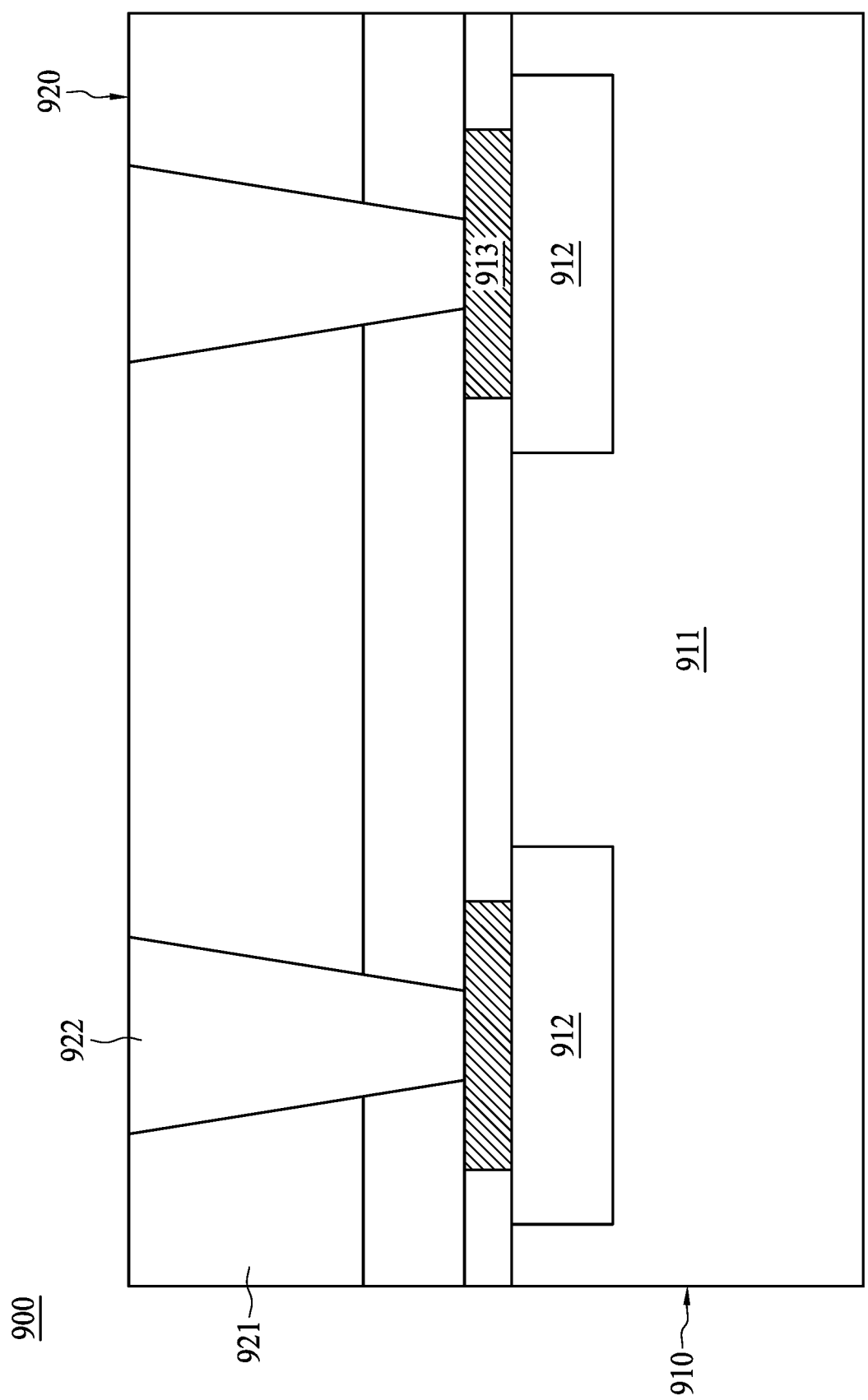
FIG. 10 is a cross-sectional view of the semiconductor structure along a line A-A in FIG. 9.

In accordance with some embodiments of the disclosure, FIG. 9 is a top view of a semiconductor structure 900 and FIG. 10 is a cross-sectional view of the semiconductor structure 900 along a line A-A in FIG. 9. With reference to FIG. 9 and FIG. 10, in some embodiments, the semiconductor structure 900 includes a first semiconductor device 910 and a second semiconductor device 920. In some embodiments, embodiments of the first semiconductor device 910 and the second semiconductor device 920 are similar to those of the first semiconductor device 110 and the second semiconductor device 120 in FIG. 1 and FIG. 2, and repeated details thereof are omitted for brevity.

The difference between the first semiconductor device 910 and the first semiconductor device 110 is that the first semiconductor device 910 includes a plurality of first conductive pads 912 and a plurality of second conductive pads 913, in contrast to the first semiconductor device 110, which includes a single first conductive pad 112 and a single second conductive pad 113. The difference between the second semiconductor device 920 and the second semiconductor device 120 is that the second semiconductor device 920 includes a plurality of via structures 922, in contrast to the second semiconductor device 120, which includes a single via structure 122. It should be noted that the semiconductor material of the first semiconductor substrate 911 and the second semiconductor substrate 921 are similar to that of the first semiconductor substrate 111 and the second semiconductor substrate 121 in FIG. 2, and repeated descriptions thereof are omitted for brevity. The via structures 922 are similar to the via structure 122 in FIG. 2, and repeated description thereof is omitted for brevity.

It should be understood that the quantities of the first conductive pads 912, the second conductive pads 913 and the via structures 922 are not limited. Moreover, the quantities of the first conductive pads 912, the second conductive pads 913 and the via structures 922 may be the same or different. The embodiment illustrated in FIGS. 9 and 10 uses two first conductive pads 912, two second conductive pads 913 and two via structures 922 as an example. It should be noted that in other embodiments, some first conductive pads 912 may connect to the via structures 922 without the second conductive pad 913 disposed therebetween.

Similar to the embodiment illustrated in FIG. 2, chemical reactivity of the second conductive pads 913 is less than chemical reactivity of the first conductive pads 912. In other words, the second conductive pads 913 are less easily oxidized than the first conductive pads 912. Moreover, in some embodiments, the second conductive pads 913 serve as a layer for filling the gap between the first conductive pads 912 and the via structures 922.

Figure 11:
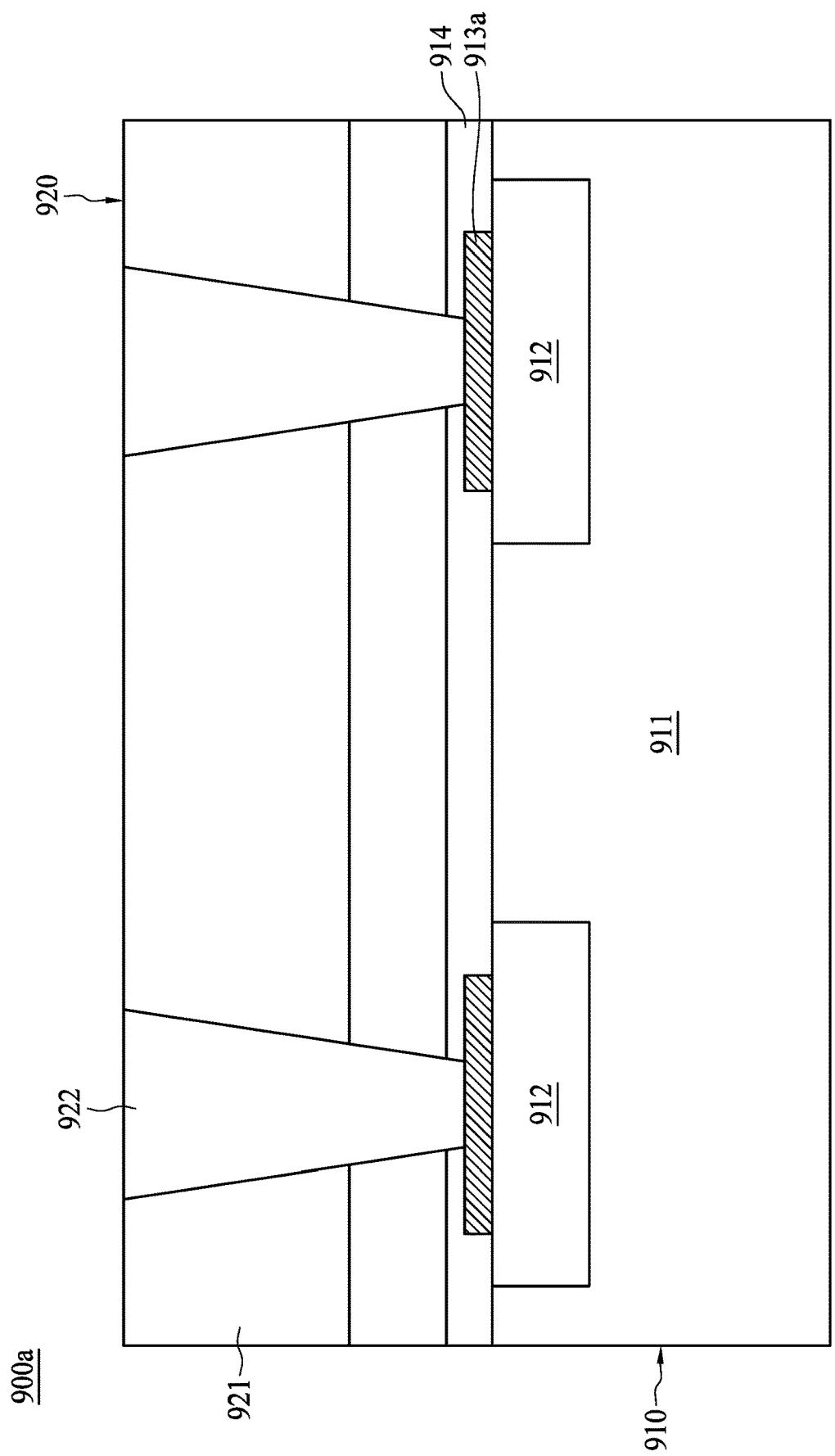
FIG. 11 and FIG. 12 are cross-sectional views of semiconductor structures in accordance with some embodiments of the present disclosure.
Figure 12:
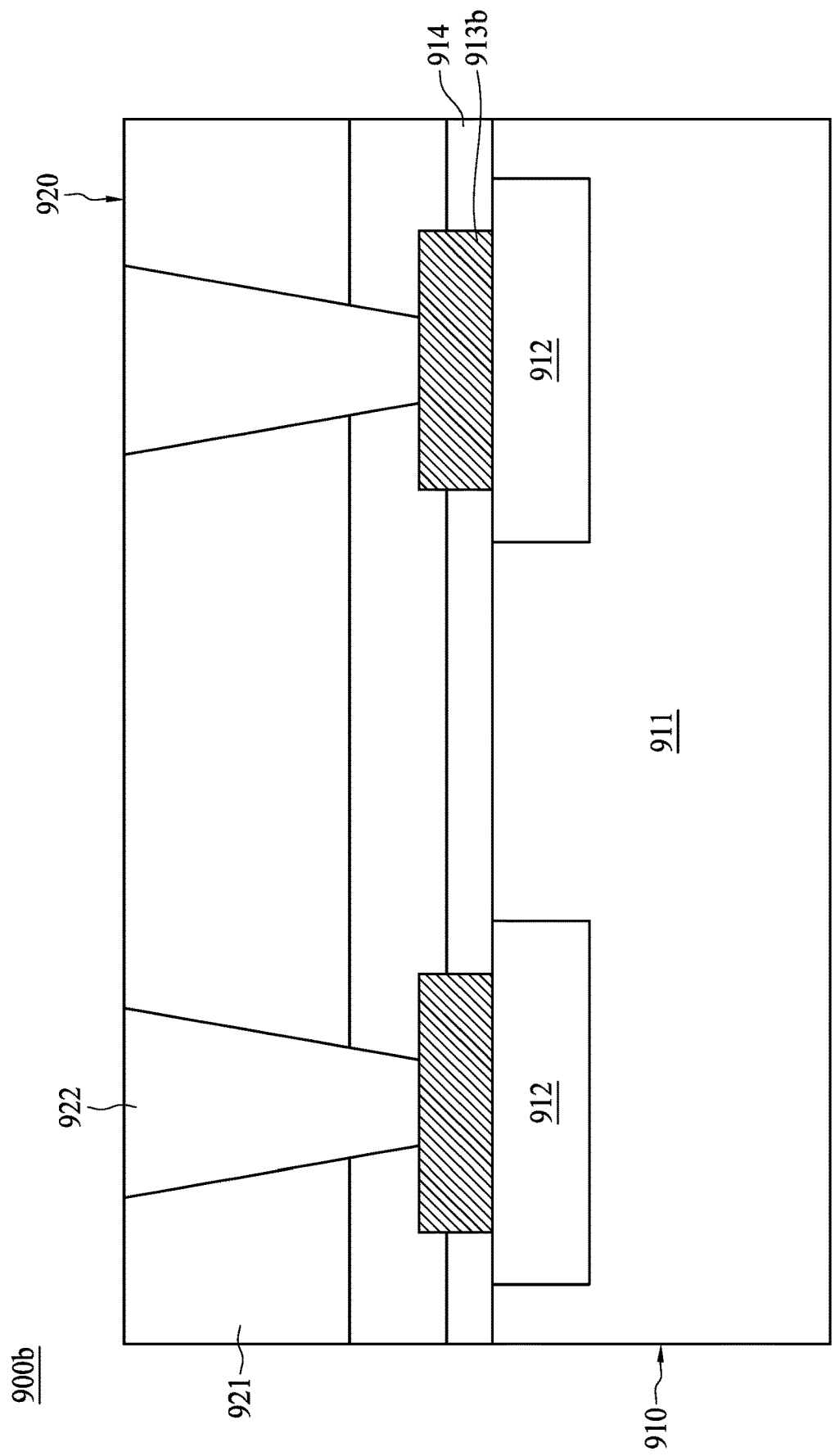

FIG. 11 and FIG. 12 are cross-sectional views of semiconductor structures 900a and 900b, respectively. As shown in FIG. 11, in some embodiments, upper surfaces of second conductive pads 913a may be lower than an upper surface of a dielectric layer 914. In other words, the dielectric layer 914 may cover a portion of the upper surfaces of the second conductive pads 913a. It should be noted that the dielectric layer 914 is similar to the dielectric layer 114 in FIG. 2. The dielectric layer 914 may protect the second conductive pads 913a from oxidization.

As shown in FIG. 12, in some embodiments, upper surfaces of second conductive pads 913b may be higher than the upper surface of the dielectric layer 914. In other words, the second conductive pads 913b may protrude from the dielectric layer 914. The protruding second conductive pads 913b may reduce the aspect ratio of the via structure 922.

It should be understood that the embodiments described in reference to FIG. 4, FIG. 5, FIG. 6, FIG. 7 and FIG. 8 may be adapted to the embodiments described in reference to FIG. 10, FIG. 11 and FIG. 12, and vice versa.

In summary, referring back to FIG. 10, the second conductive pads 913 are less easily oxidized than the first conductive pads 912 and the second conductive pads 913 may protect the first conductive pads 912 from oxidization. As a result, conductivity between the first conductive pads 912, the second conductive pads 912 and the via structures 922 may be increased, and the device stability of the semiconductor structure 900 is improved.

In addition, aspect ratios of the via structures 922 are less than the aspect ratio of the via structure 322 of the semiconductor structure 300 in FIG. 3. In other words, the via structures 922 are relatively short in the vertical dimension and wide in the horizontal dimension. As a result, a yield rate of the via structures 922 is increased.

Figure 13:
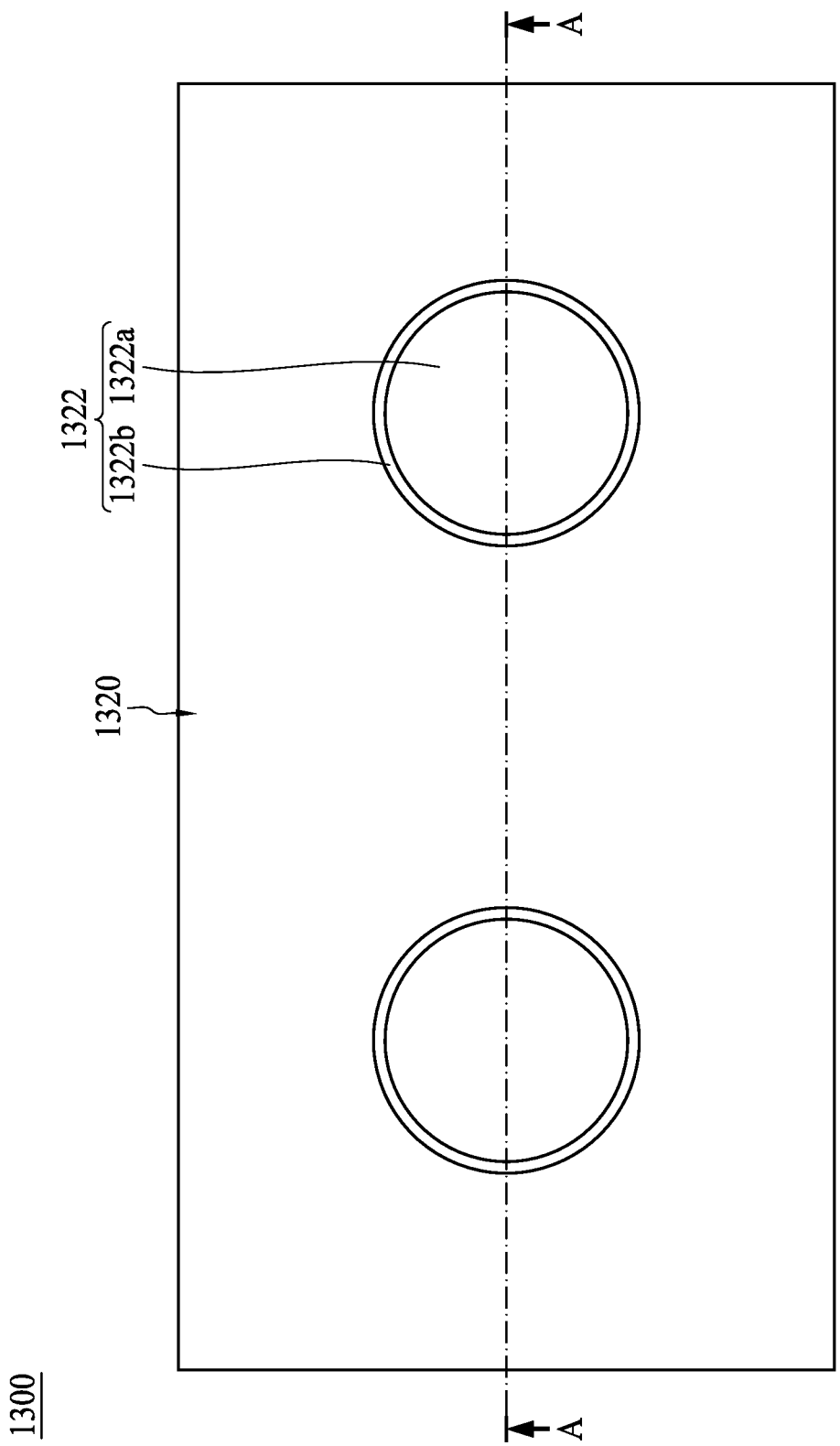
FIG. 13 is a top view of a semiconductor structure in accordance with some embodiments of the present disclosure.
Figure 14:
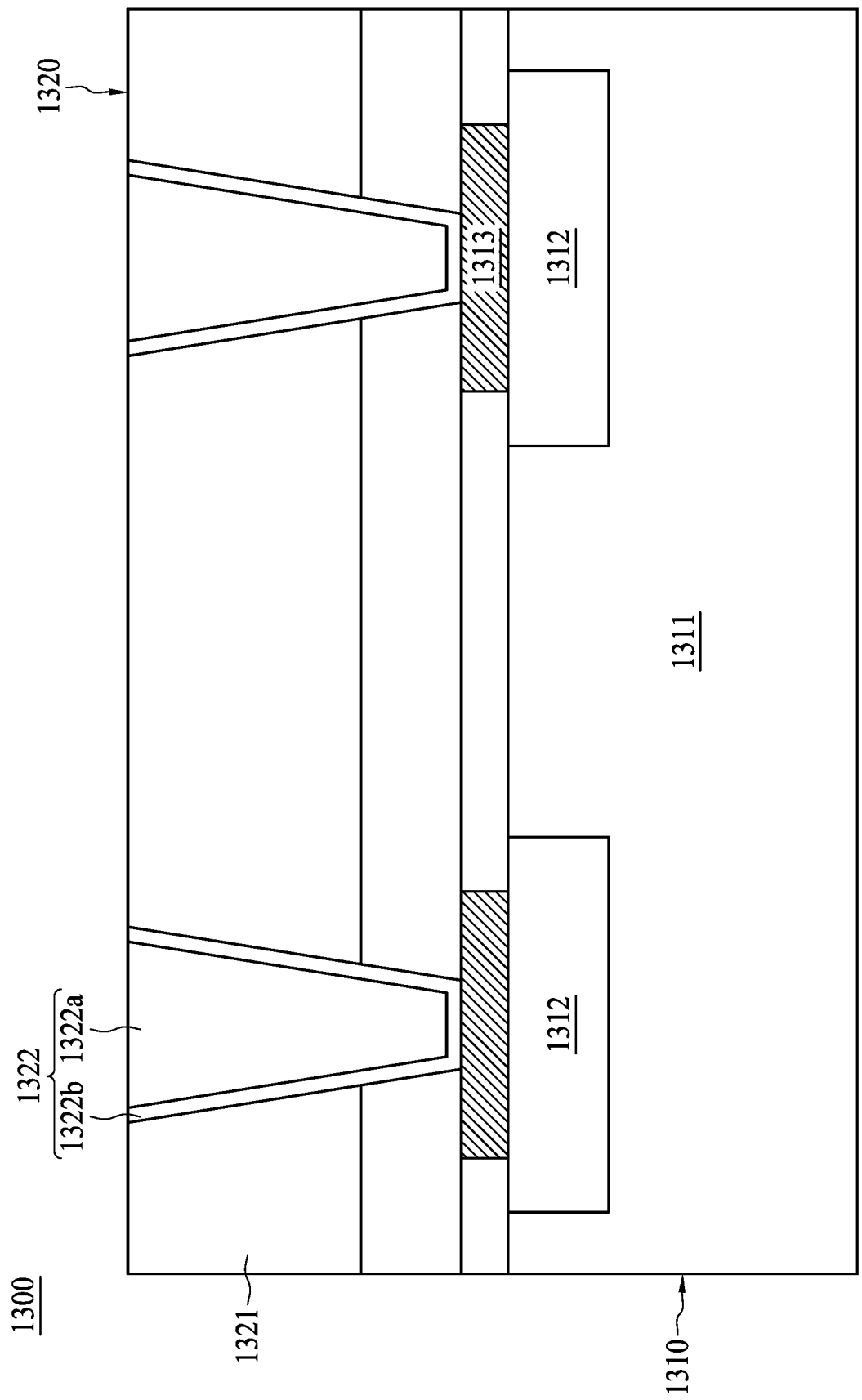
FIG. 14 is a cross-sectional view of the semiconductor structure along a line A-A in FIG. 13.

In accordance with some embodiments of the disclosure, FIG. 13 is a top view of a semiconductor structure 1300 and FIG. 14 is a cross-sectional view of the semiconductor structure 1300 along a line A-A in FIG. 13. With reference to FIG. 13 and FIG. 14, in some embodiments, the semiconductor structure 1300 includes a first semiconductor device 1310 and a second semiconductor device 1320. Embodiments of the first semiconductor device 1310 and the second semiconductor device 1320 are similar to those of the first semiconductor device 110 and the second semiconductor device 120 in FIG. 1 and FIG. 2, and repeated descriptions thereof are omitted for brevity.

Differences between the semiconductor structure 1300 and the semiconductor structure 900 in FIG. 9 are that a via structure 1322 of the second semiconductor device 1320 may have a conductive layer 1322a and a barrier layer 1322b, in contrast to the via structure 922, which includes only a conductive material. The barrier layer 1322b is disposed on the conductive layer 1322a. In some embodiments, the barrier material for forming the barrier layer 1322b includes titanium nitride, tungsten nitride, tantalum nitride, indium oxide, cobalt, ruthenium, tantalum, or a combination thereof. The barrier layer 1322b covers the conductive layer 1322a to protect an underlying conductive pad (for example, a second conductive pad 1313) from electromigration.

It should be noted that a first conductive pad 1312 and the second conductive pad 1313 are similar to the first conductive pads and the second conductive pads described in reference to FIG. 2, FIG. 10, FIG. 11, FIG. 12, and repeated descriptions thereof are omitted for brevity. It should also be understood that the embodiments described in reference to FIG. 4, FIG. 5, FIG. 6, FIG. 7 and FIG. 8 may be adapted to the embodiments described in reference to FIG. 13 and FIG. 14, and vice versa.

In summary, the second conductive pads 1313 are less easily oxidized than the first conductive pads 1212 and the second conductive pads 1313 may protect the first conductive pads 1312 from oxidization. As a result, the conductivity between the first conductive pads 1312, the second conductive pads 1313 and the via structures 1322 may be increased, and the device stability of the semiconductor structure 1300 is improved.

In addition, the aspect ratio of the via structures 1322 is less than that of the semiconductor structure 300 in FIG. 3. In other words, the via structures 1322 are relatively short in the vertical dimension and wide in the horizontal dimension. As a result, a yield rate of the via structures 1322 is increased. Moreover, the barrier layer 1322b may protect the second conductive pad 1313 from electromigration.

Figure 15:
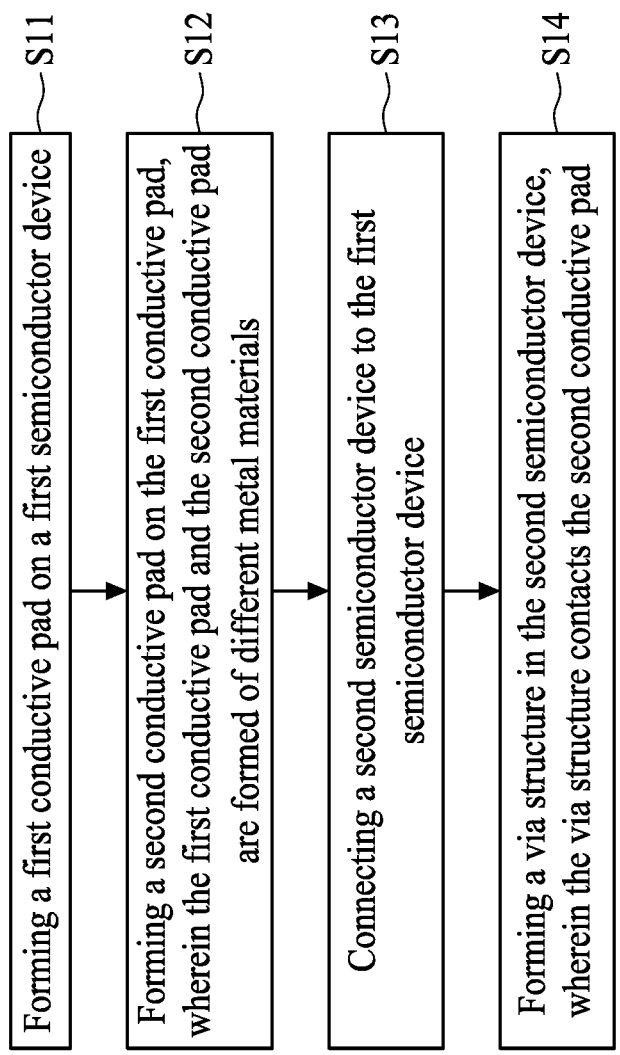
FIG. 15 is a flowchart illustrating a method of manufacturing a semiconductor structure in accordance with some embodiments of the present disclosure.

In accordance with some embodiments of the present disclosure, FIG. 15 is a flowchart illustrating a method of manufacturing the semiconductor structure 100.

Referring to FIG. 15, in some embodiments, the method 10 includes operations S11 to S14. In operation S11, a first conductive pad is formed on a first semiconductor device. In operation S12, a second conductive pad is formed on the first conductive pad, wherein the first conductive pad and the second conductive pad are formed of different metal materials. In operation S13, a second semiconductor device is connected to the first semiconductor device. In operation S14, a via structure is formed in the second semiconductor device, wherein the via structure contacts the second conductive pad.

Figure 16:
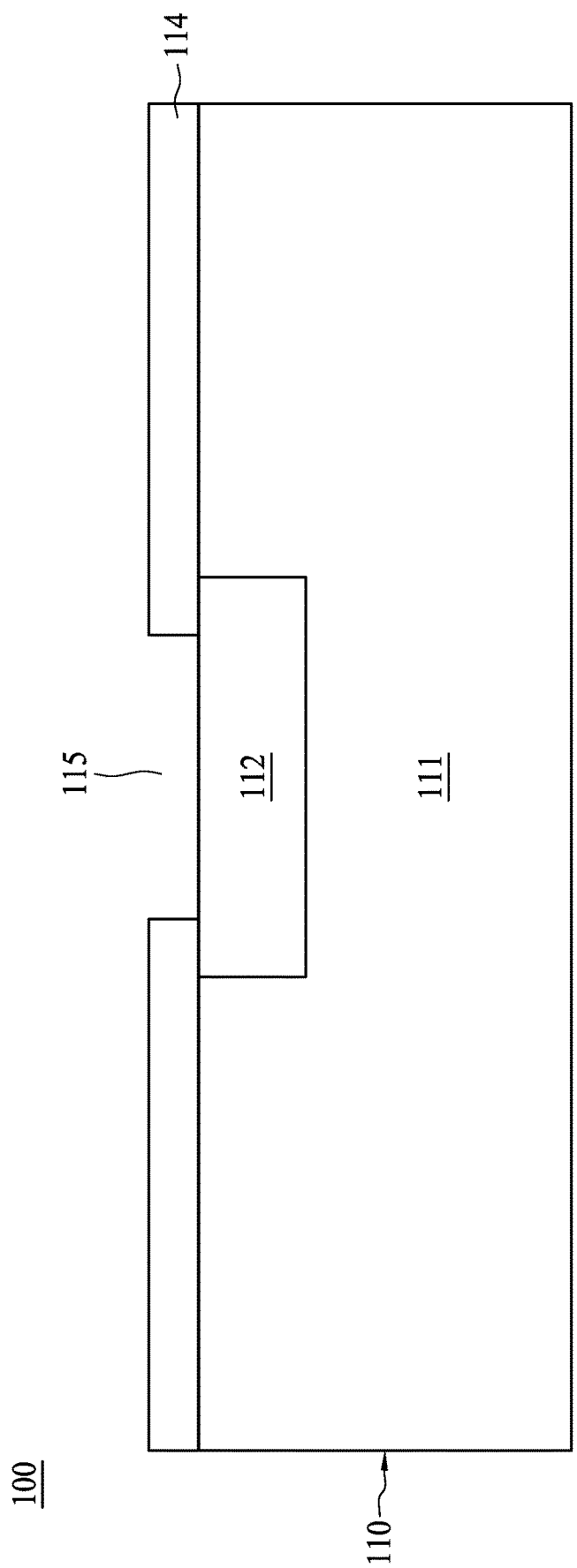
FIG. 16, FIG. 17, FIG. 18, FIG. 19 and FIG. 20 are cross-sectional views of the semiconductor structure along the line A-A in FIG. 1 at various stages of manufacture.

In accordance with some embodiments of the present disclosure, FIG. 16, FIG. 17, FIG. 18, FIG. 19 and FIG. 20 are cross-sectional views of the semiconductor structure 100 along a line A-A in FIG. 1 at various stages of manufacture. Referring to FIG. 16 and operation S11 in FIG. 15, in operation S11, the first conductive pad 112 is formed on the first semiconductor device 110. An embodiment of the first semiconductor device 110 is described in reference to FIG. 1 and FIG. 2, and repeated descriptions thereof are omitted for brevity.

In some embodiments, the first semiconductor device 110 includes a first semiconductor substrate 111 and a dielectric layer 114. The first semiconductor substrate 111 may be made of semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The dielectric layer 114 may include dielectric materials, such as oxide, nitride, polymer or the like.

In some embodiments, after the first conductive pad 112 is formed, the dielectric layer 114 is formed on the first conductive pad 112. Subsequently, an opening 115 is formed in the dielectric layer 114 to expose the first conductive pad 112. It should be understood that a size and shape of the opening 115 are not limited. It should be noted that after the first conductive pad 112 is exposed through the dielectric layer 114, the first conductive pad 112 may be connected to a test apparatus for testing operation.

Figure 17:
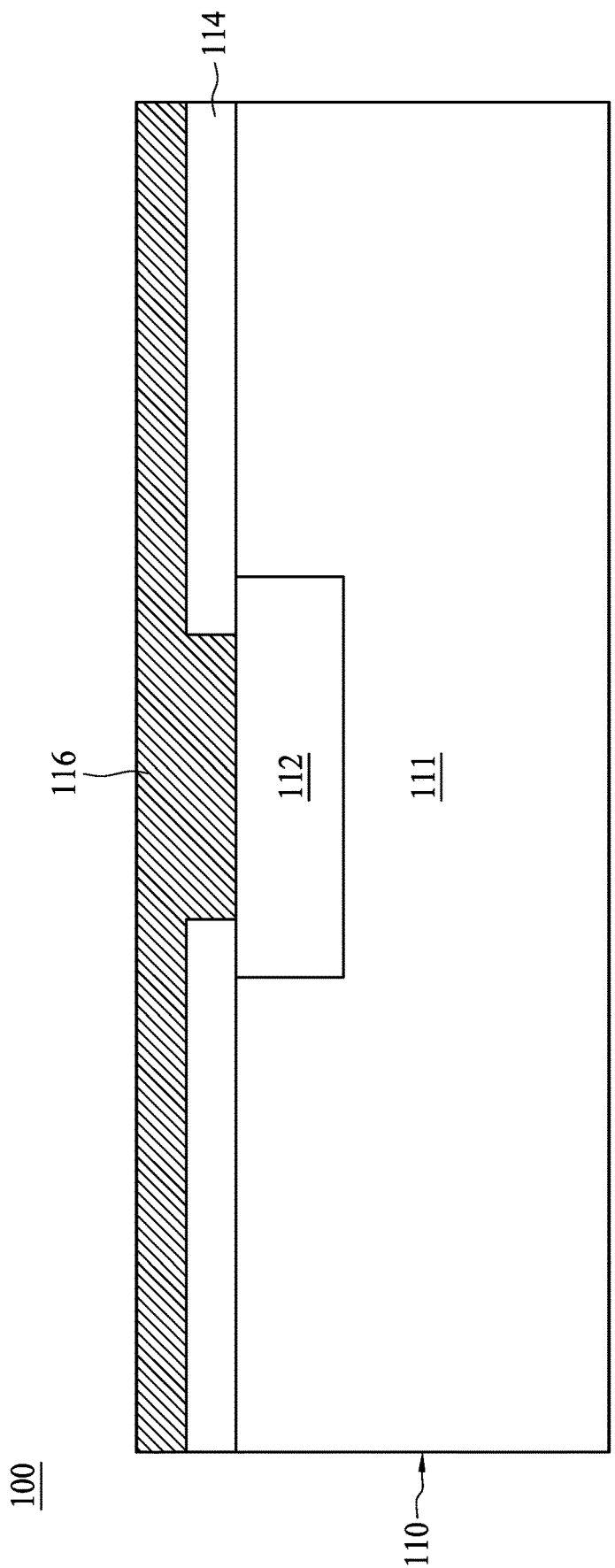

Referring to FIG. 17, a conductive layer 116 is formed on the first conductive pad 112 and the dielectric layer 114. In some embodiments, the first conductive pad 112 and the conductive layer 116 are formed of different metal materials.

Figure 18:
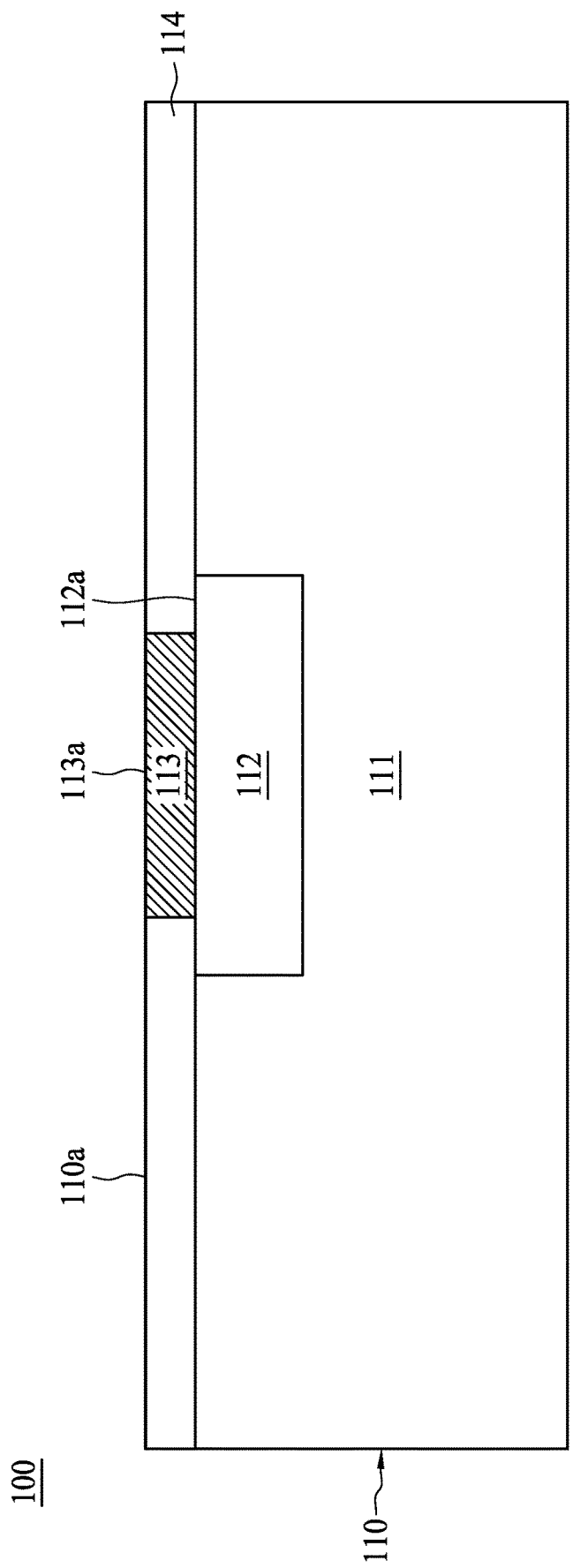

Referring to FIG. 18 and operation S12 in FIG. 15, in operation S12, the second conductive pad 113 is formed on the first conductive pad 112. In some embodiments, the second conductive pad 113 may be formed by planarizing the conductive layer 116 in FIG. 16 to be coplanar with the dielectric layer 114. The second conductive pad 113 may be planarized using a chemical mechanical planarization (CMP) process. As described above, the first conductive pad 112 and the second conductive pad 113 are formed of different metal materials. In some embodiments, chemical reactivity of the second conductive pad 113 is less than chemical reactivity of the first conductive pad 112. In other words, the second conductive pad 113 is less easily oxidized than the first conductive pad 112.

In some embodiments, the second conductive pad 113 may be used as a protective layer for the first conductive pad 112. The first conductive pad 112 may be oxidized when an upper surface of the first conductive pad 112 is exposed through the layer formed thereon. In some embodiments, the second conductive pad 113 may protect the first conductive pad 112 from oxidization. In other words, the second conductive pad 113 may mitigate the effect of the oxidization of the first conductive pad 112.

In some embodiments, the second conductive pad 113 may serve as a layer for filling the gap between an upper surface 112a of the first conductive pad 112 and an upper surface 110a of the first semiconductor device 110. A thickness of the first conductive pad 112 may be decreased during different manufacturing operations, for example but not limited to, an etching operation, a probing operation, or another operation during manufacturing. In some embodiments, the second conductive pad 113 may fill a space created by the decreased thickness of the first conductive pad 112. In other words, the second conductive pad 113 may mitigate the effect of the decreased thickness of the first conductive pad 112.

In some embodiments, an upper surface 113a of the second conductive pad 113 is substantially coplanar with the upper surface 110a of the first semiconductor device 110. A thickness of the second conductive pad 113 may be less than the thickness of the first conductive pad 112. In some embodiments, the thickness of the second conductive pad 113 may be less than 1 μm.

Figure 19:
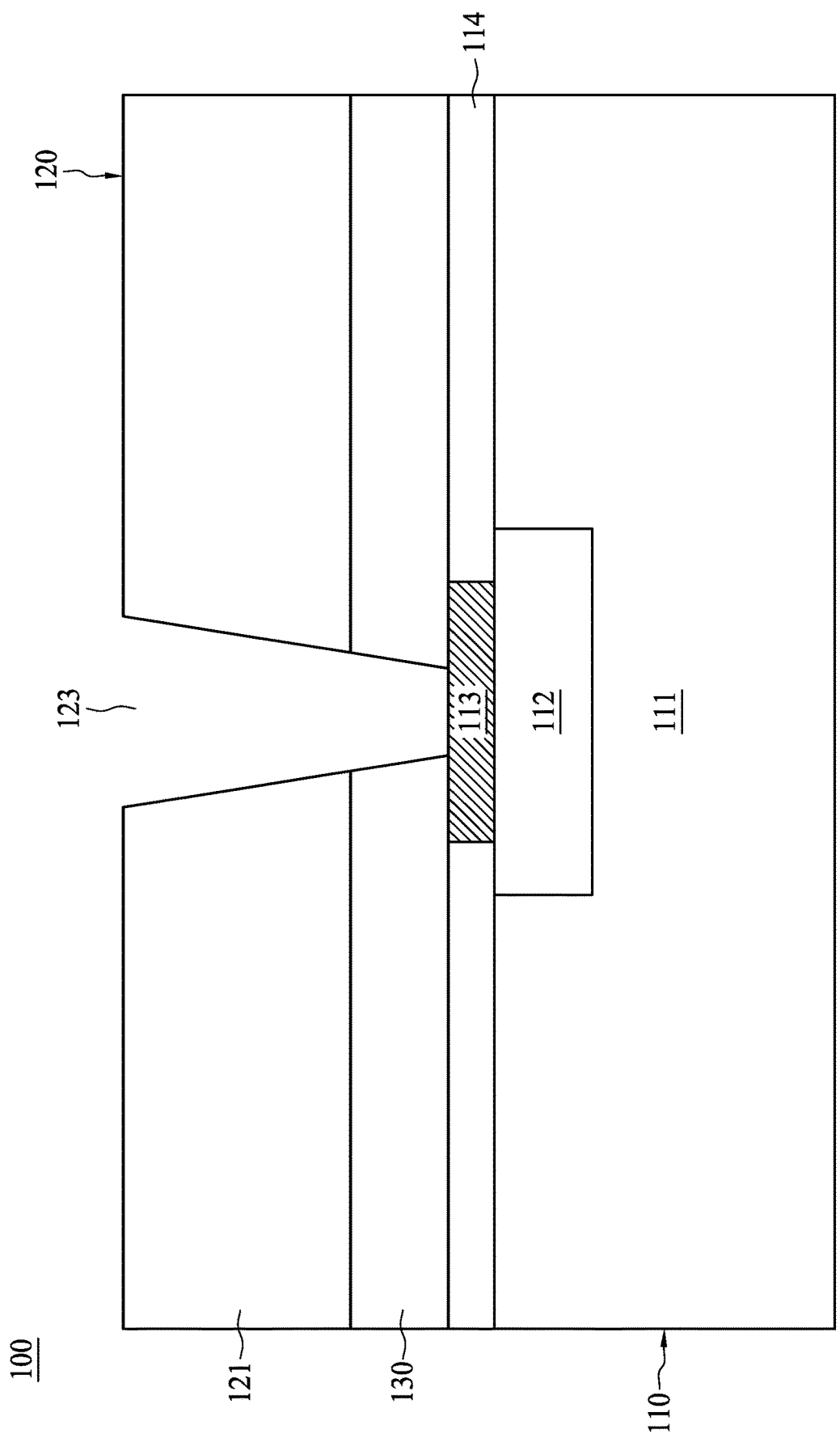

Referring to FIG. 19 and operation S13 in FIG. 15, in operation S13, the second semiconductor device 120 is connected to the first semiconductor device 110. An embodiment of the second semiconductor device 120 is described in reference to FIG. 1 and FIG. 2, and repeated descriptions thereof are omitted for brevity. In some embodiments, the second semiconductor device 120 is connected to the first semiconductor device 110 by the adhesive layer 130.

A via 122 or a trench 123 may be formed in the second semiconductor device 120. In some embodiments, an aspect ratio of the via 122 is less than 10:1. In other embodiments, the aspect ratio of the via 122 may be as low as 8:1. In other words, the via 122 is relatively short in the vertical dimension and wide in the horizontal dimension.

Figure 20:
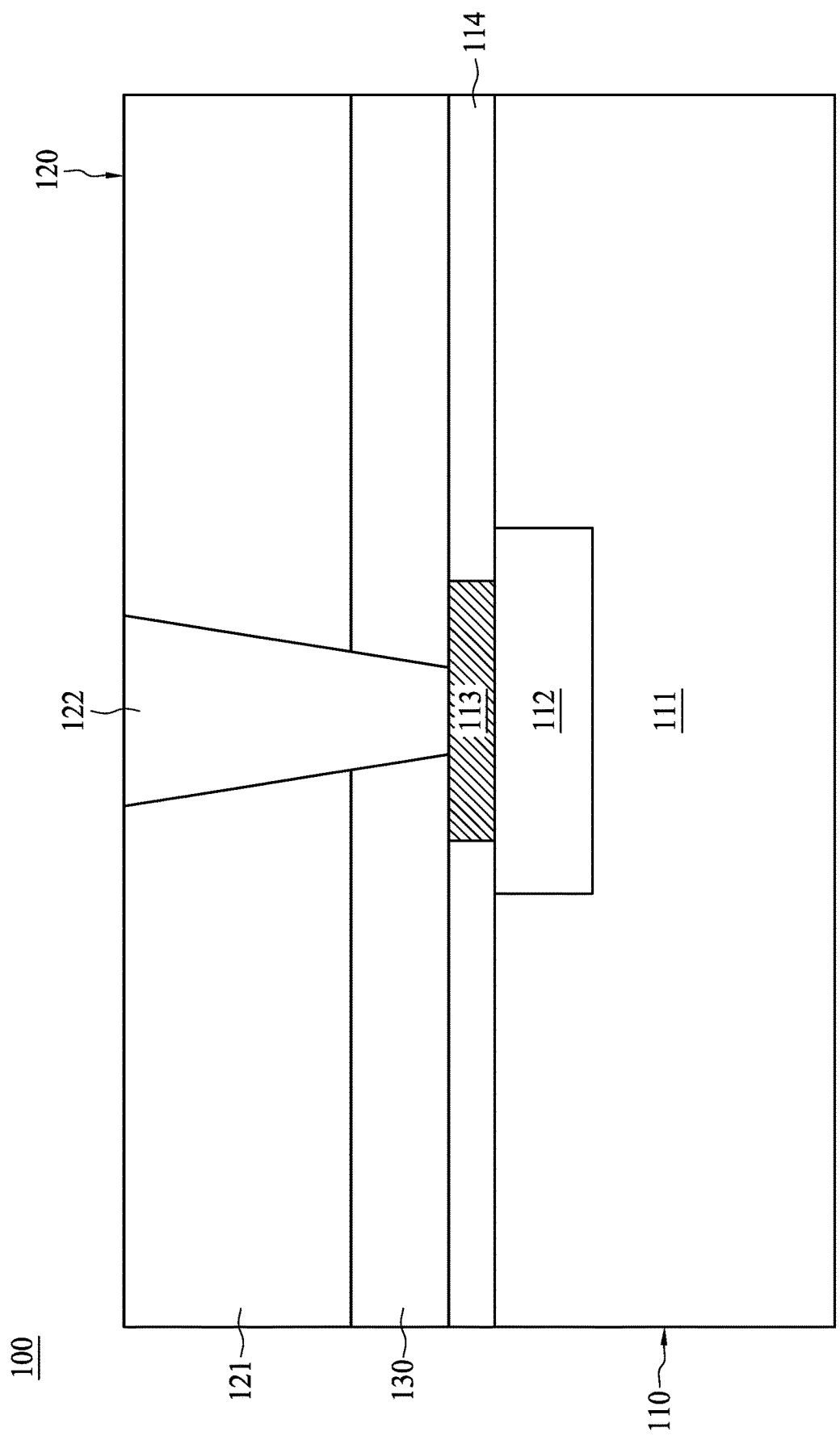

Referring to FIG. 20 and operation S14 in FIG. 15, in operation S14, the via structure 122 is formed in the second semiconductor device 120. The via structure 122 contacts the second conductive pad 113. The via structure 122 is formed of conductive material. In some embodiments, the via structure 122 may be a through substrate via or a through silicon via (TSV).

It should be understood that the embodiments described in reference to FIG. 4, FIG. 5, FIG. 6, FIG. 7, FIG. 8, FIG. 9, FIG. 10, FIG. 11, FIG. 12, FIG. 13 and FIG. 14 may also be realized based on the embodiments described in reference to FIG. 15.

In summary, the semiconductor structure of the present disclosure may include a conductive pad having different chemical reactivity at different positions. For example, chemical reactivity of an upper portion (for example, the second conductive pad 113) in the conductive pad is less than chemical reactivity of a lower portion (for example, the first conductive pad 112) in the conductive pad. Thus, the upper portion is less easily oxidized than the lower portion and the oxidization of the first conductive pad may be prevented. As a result, the conductivity between the first conductive pad and the via structure may be increased, and the device stability of the semiconductor structure may be improved.

Moreover, the aspect ratio of the via structure in the semiconductor device (for example, the second semiconductor device 120) may be reduced. In other words, the via structure may be relatively short in the vertical dimension and wide in the horizontal dimension. As a result, a yield rate of the via structure may be increased. In summary, the semiconductor structure of the present disclosure may improve the device stability and increase the yield rate compared to the conventional semiconductor structure.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A method of manufacturing a semiconductor structure, comprising:
    forming a first conductive pad on a first semiconductor device;
    forming a second conductive pad on the first conductive pad, wherein an upper surface of the first conductive pad is in direct contact with a bottom surface of the second conductive pad, wherein a width of the second conductive pad is smaller than a width of the first conductive pad;
    connecting a second semiconductor device to the first semiconductor device via an adhesive layer; and
    forming a via structure in the second semiconductor device, wherein the via structure, having a trapezoid shape, has a width gradually reduced from an upper surface of the via structure to a bottom surface thereof, wherein the upper surface of the via structure is coplanar with an upper surface of the second semiconductor device, wherein the via structure is extended through the adhesive layer at a position that the bottom surface of the via structure contacts an upper surface of the second conductive pad, wherein a width of the bottom surface of the via structure is smaller than the width of the second conductive pad;
    wherein the first conductive pad and the second conductive pad are formed of different metal materials;
    wherein the forming of the second conductive pad on the first conductive pad comprises: forming a dielectric layer on the first conductive pad; forming an opening in the dielectric layer to expose the first conductive pad; and forming the second conductive pad in the opening, wherein a width of the opening is less than the width of the first conductive pad, wherein the opening is a through opening having a depth equal to a thickness of the dielectric layer, such that the upper surface of the second conductive pad is coplanar with an upper surface of the dielectric layer while a bottom surface of the second conductive pad is coplanar with a bottom surface of the dielectric layer, wherein the upper surface of the second conductive pad is in direct contact with the bottom surface of the via structure while the bottom surface of the second conductive pad is in direct contact with the upper surface of the first conductive pad, wherein the adhesive layer, which is a single layer, has an upper side bonded to a bottom surface of the second semiconductor device and a bottom side bonded to the upper surface of the dielectric layer and the upper surface of the second conductive pad.

2. The method of claim 1, wherein the forming the first conductive pad comprises: embedding the first conductive pad in a first semiconductor substrate of the first semiconductor device at a position that the upper surface of the first conductive pad is coplanar with an upper surface of the first semiconductor substrate and a bottom surface of the first conductive pad is located above a bottom surface of the first semiconductor substrate, wherein a height of the first conductive pad is less than a height of the first semiconductor substrate.

3. The method of claim 1, further comprising: forming the first conductive pad and the second conductive pad with chemical reactivity that increase at positions along a direction from the via structure to the first semiconductor device, wherein the chemical reactivity of the second conductive pad is less than the chemical reactivity of the first conductive pad.

4. The method of claim 1, further comprising: forming the second conductive pad with a thickness less than a thickness of the first conductive pad, wherein forming the second conductive pad on the first conductive pad comprises: forming a conductive layer on the first conductive pad, and planarizing the conductive layer to coplanar with the upper side of the dielectric layer in order to form the second conductive pad.

5. The method of claim 1, further comprising: forming a step structure of the first conductive pad and the second conductive pad, wherein a step height of the step structure is less than 1 μm.

6. The method of claim 1, further comprising: forming the via structure with an aspect ratio less than 10:1.

7. The method of claim 1, wherein the first conductive pad comprises copper (Cu), aluminum (Al), or a combination thereof.

8. The method of claim 7, wherein the second conductive pad comprises tungsten (W), gold (Au), silver (Ag), or a combination thereof, wherein forming the second conductive pad on the first conductive pad comprises: filling the second conductive pad on the first conductive pad.

9. The method of claim 1, wherein forming the second conductive pad on the first conductive pad comprises: forming a conductive layer on the first conductive pad, and planarizing the conductive layer to reduce a thickness of the conductive layer in order to form the second conductive pad.

10. The method of claim 1, wherein the via structure is a through silicon via (TSV).

* * * * *